(12) United States Patent
Chung et al.

(10) Patent No.: US 11,948,989 B2
(45) Date of Patent: Apr. 2, 2024

(54) GATE-ALL-AROUND DEVICE WITH PROTECTIVE DIELECTRIC LAYER AND METHOD OF FORMING THE SAME

(71) Applicant: Taiwan Semiconductor Manufacturing Co., Ltd., Hsin-Chu (TW)

(72) Inventors: Cheng-Ting Chung, Hsinchu (TW); Yi-Bo Liao, Hsinchu (TW); Hou-Yu Chen, Hsinchu County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/699,303

(22) Filed: Mar. 21, 2022

(65) Prior Publication Data

US 2022/0208982 A1 Jun. 30, 2022

Related U.S. Application Data

(63) Continuation of application No. 16/583,485, filed on Sep. 26, 2019, now Pat. No. 11,282,935.

(51) Int. Cl.
*H01L 29/423* (2006.01)
*H01L 21/306* (2006.01)
(Continued)

(52) U.S. Cl.
CPC .. *H01L 29/42392* (2013.01); *H01L 21/30604* (2013.01); *H01L 21/31111* (2013.01); *H01L 21/31144* (2013.01); *H01L 21/3212* (2013.01); *H01L 29/0673* (2013.01); *H01L 29/0847* (2013.01); *H01L 29/1037* (2013.01);
(Continued)

(58) Field of Classification Search
CPC ............ H01L 29/66795; H01L 29/775; H01L 29/0673; H01L 29/785; H01L 29/1037; H01L 29/6656; H01L 29/66545; H01L 29/78696; H01L 29/66553; H01L 29/66439; H01L 29/42392; H01L 29/401; H01L 29/0847; H01L 21/30604; H01L 21/31111; H01L 21/3212; H01L 21/31144
See application file for complete search history.

(56) References Cited

U.S. PATENT DOCUMENTS 8,772,109 B2  7/2014  Colinge
8,785,285 B2  7/2014  Tsai et al.
(Continued)

*Primary Examiner* — Vongsavanh Sengdara
(74) *Attorney, Agent, or Firm* — HAYNES AND BOONE, LLP

(57) ABSTRACT

Semiconductor device and the manufacturing method thereof are disclosed herein. An exemplary semiconductor device comprises a substrate; semiconductor layers over the substrate, wherein the semiconductor layers are separate from each other and are stacked up along a direction generally perpendicular to a top surface of the substrate; a dielectric feature over and separate from the semiconductor layers; and a gate structure wrapping around each of the semiconductor layers, the gate structure having a gate dielectric layer and a gate electrode layer, wherein the gate dielectric layer interposes between the gate electrode layer and the dielectric feature and the dielectric feature is disposed over at least a part of the gate electrode layer.

20 Claims, 24 Drawing Sheets

(51) Int. Cl.
    *H01L 21/311*     (2006.01)
    *H01L 21/321*     (2006.01)
    *H01L 29/06*     (2006.01)
    *H01L 29/08*     (2006.01)
    *H01L 29/10*     (2006.01)
    *H01L 29/40*     (2006.01)
    *H01L 29/66*     (2006.01)
    *H01L 29/78*     (2006.01)

(52) U.S. Cl.
    CPC ...... *H01L 29/401* (2013.01); *H01L 29/66545* (2013.01); *H01L 29/66553* (2013.01); *H01L 29/6656* (2013.01); *H01L 29/66795* (2013.01); *H01L 29/785* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2016/0118480 A1* | 4/2016 | Xie ................ H01L 21/823431 438/157 |
| 2018/0175214 A1* | 6/2018 | Chen ................ H01L 29/66757 |
| 2020/0105929 A1* | 4/2020 | Zhang ............... H01L 29/1033 |
| 2020/0294866 A1* | 9/2020 | Cheng ............... H01L 21/28088 |
| 2021/0098588 A1 | 4/2021 | Chung et al. |

\* cited by examiner

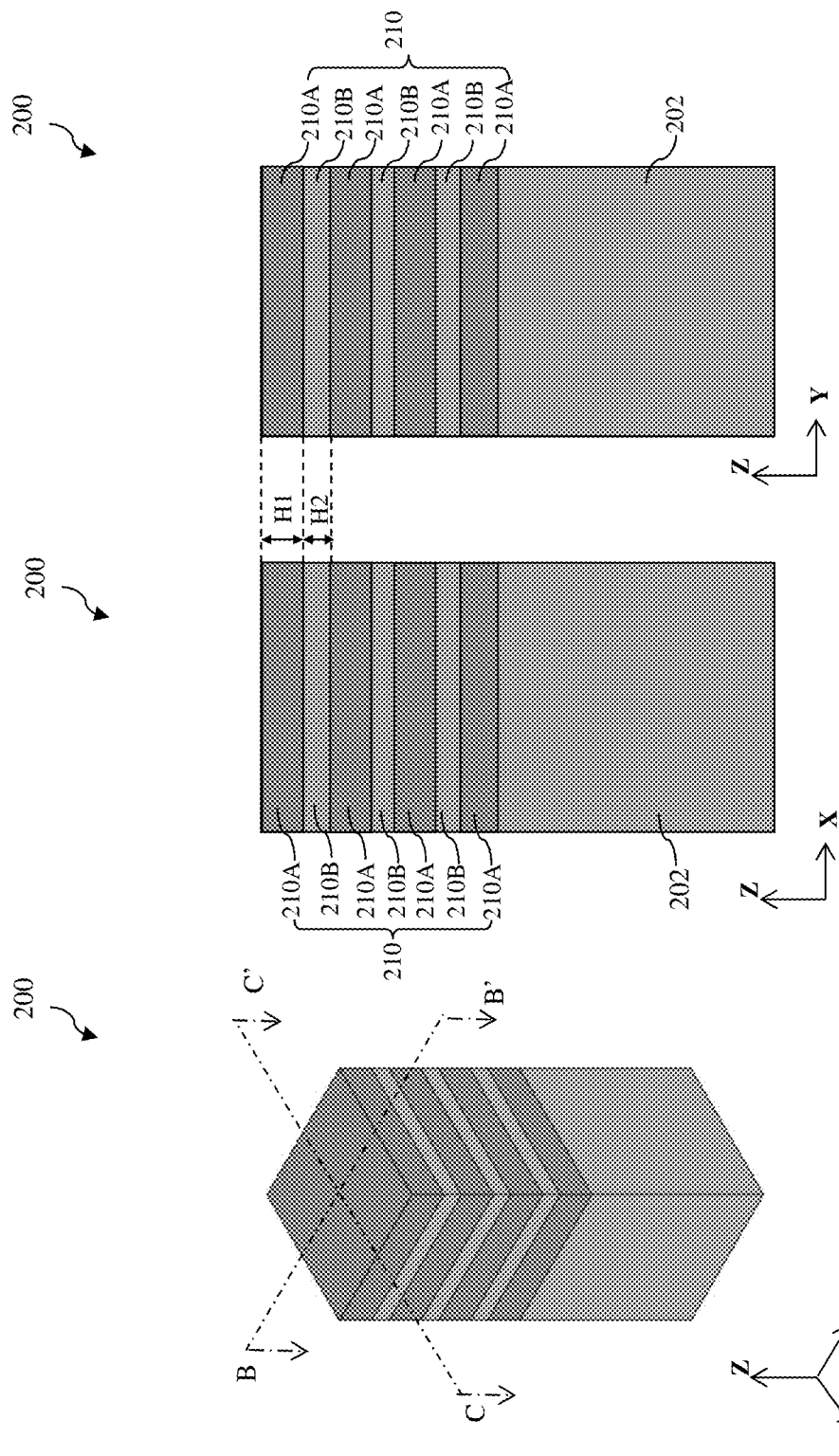

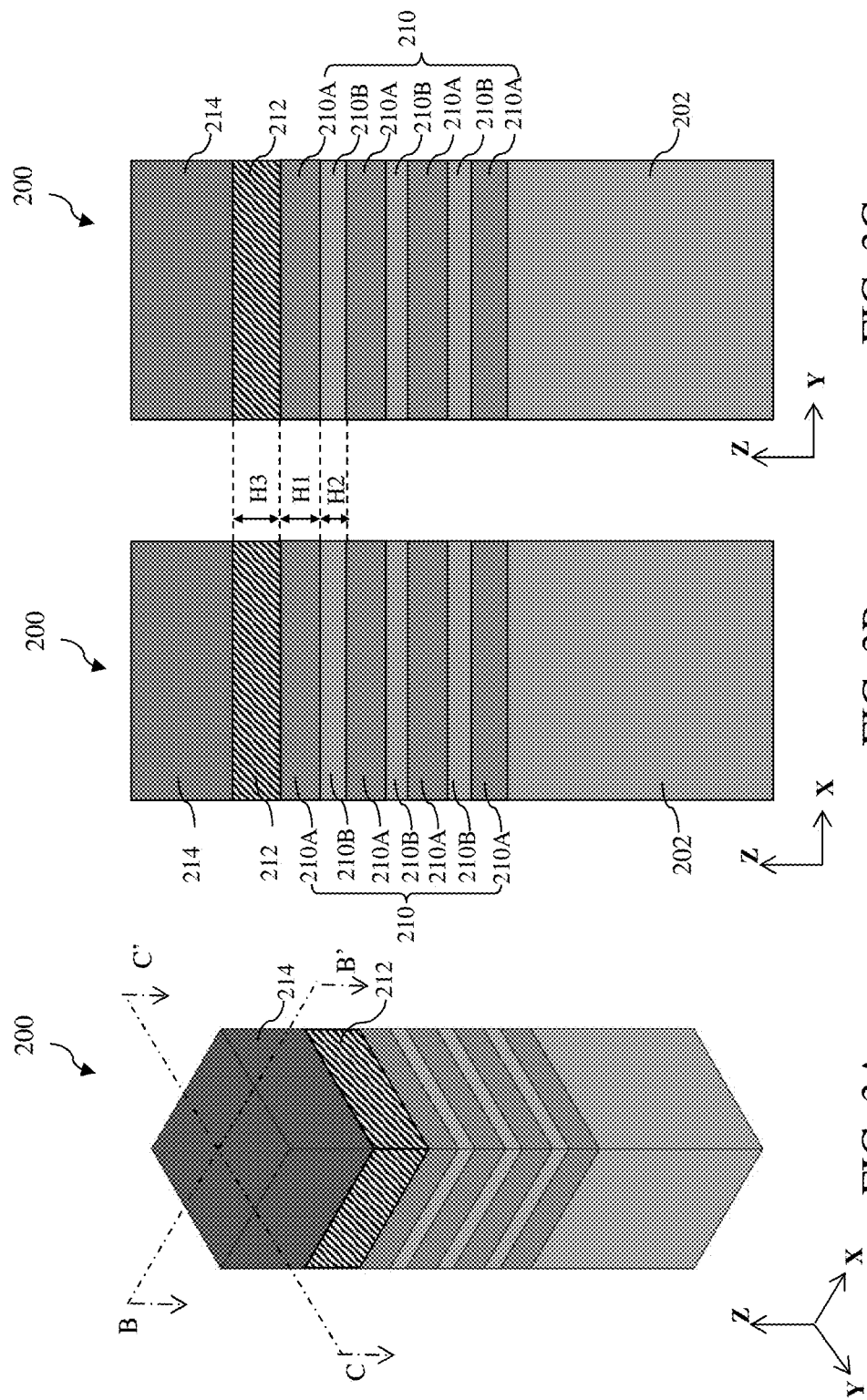

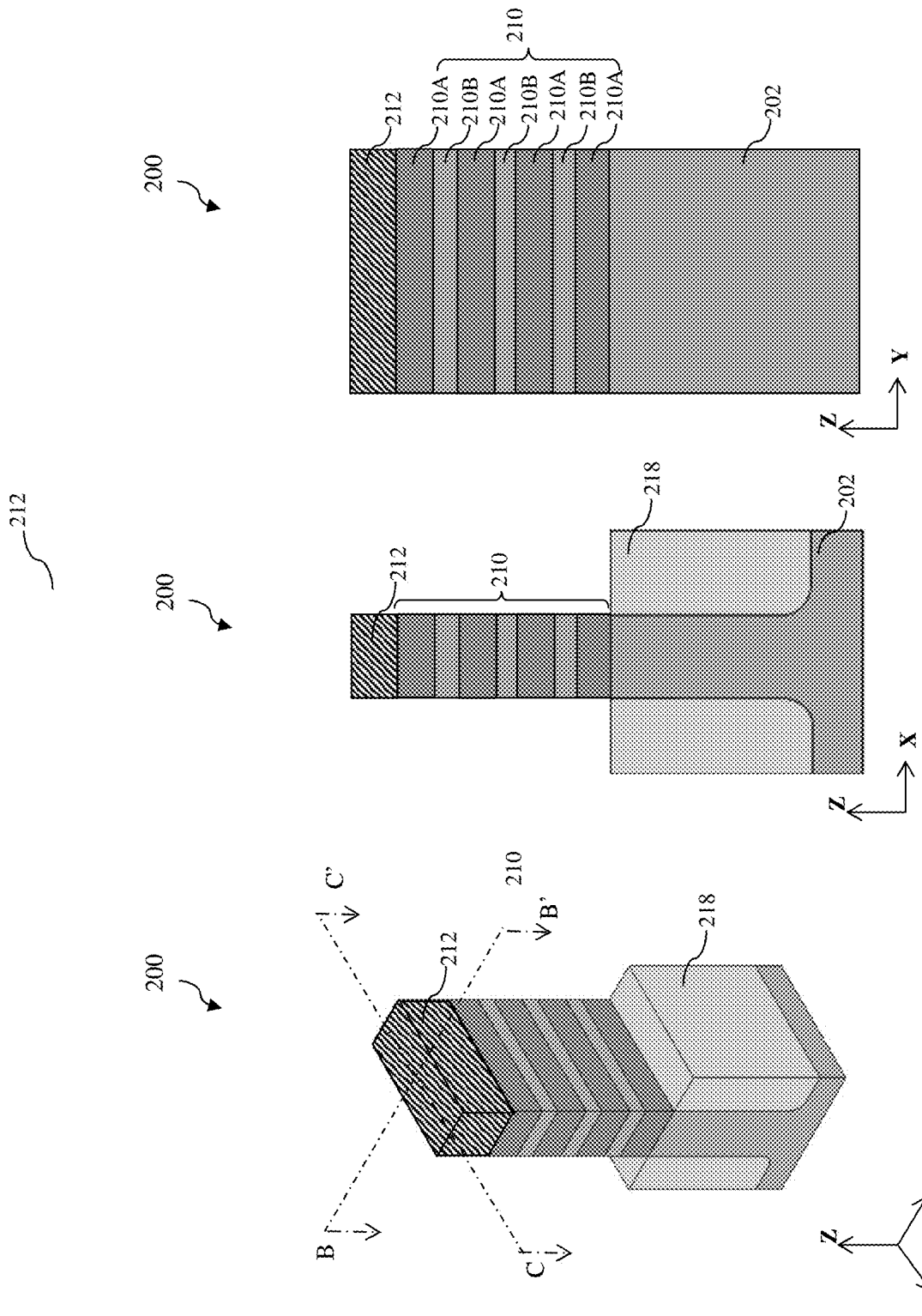

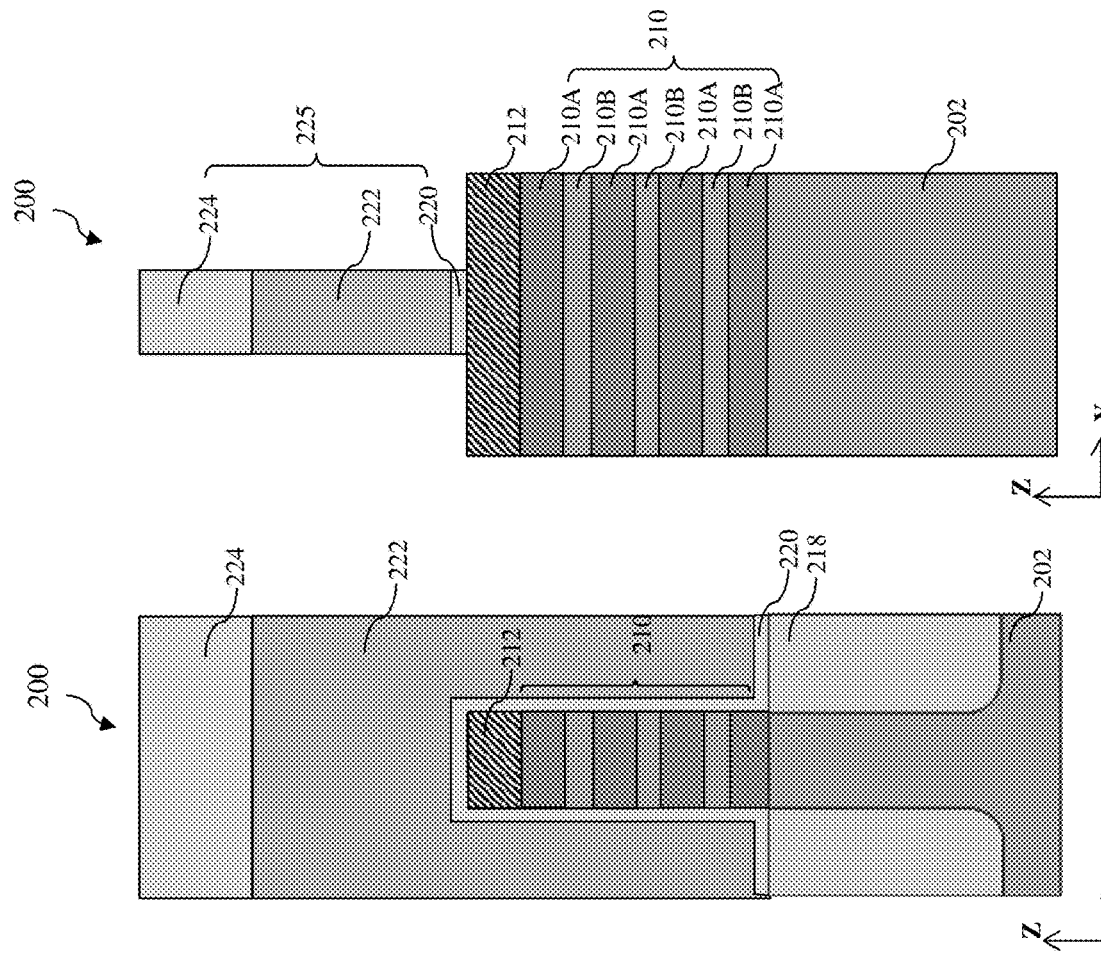
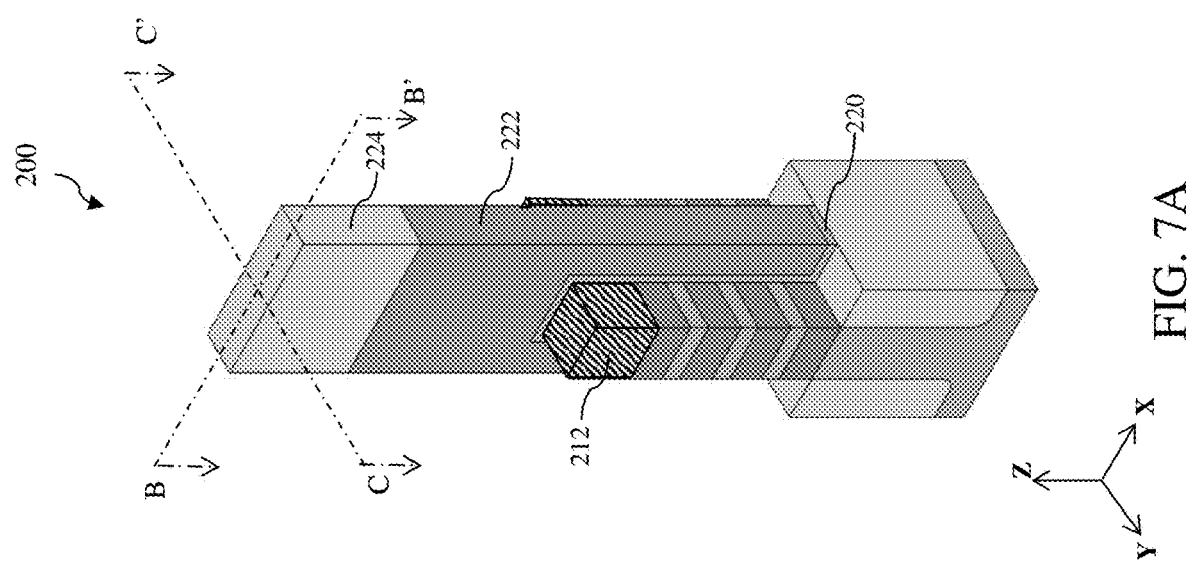
FIG. 7C   FIG. 7B   FIG. 7A

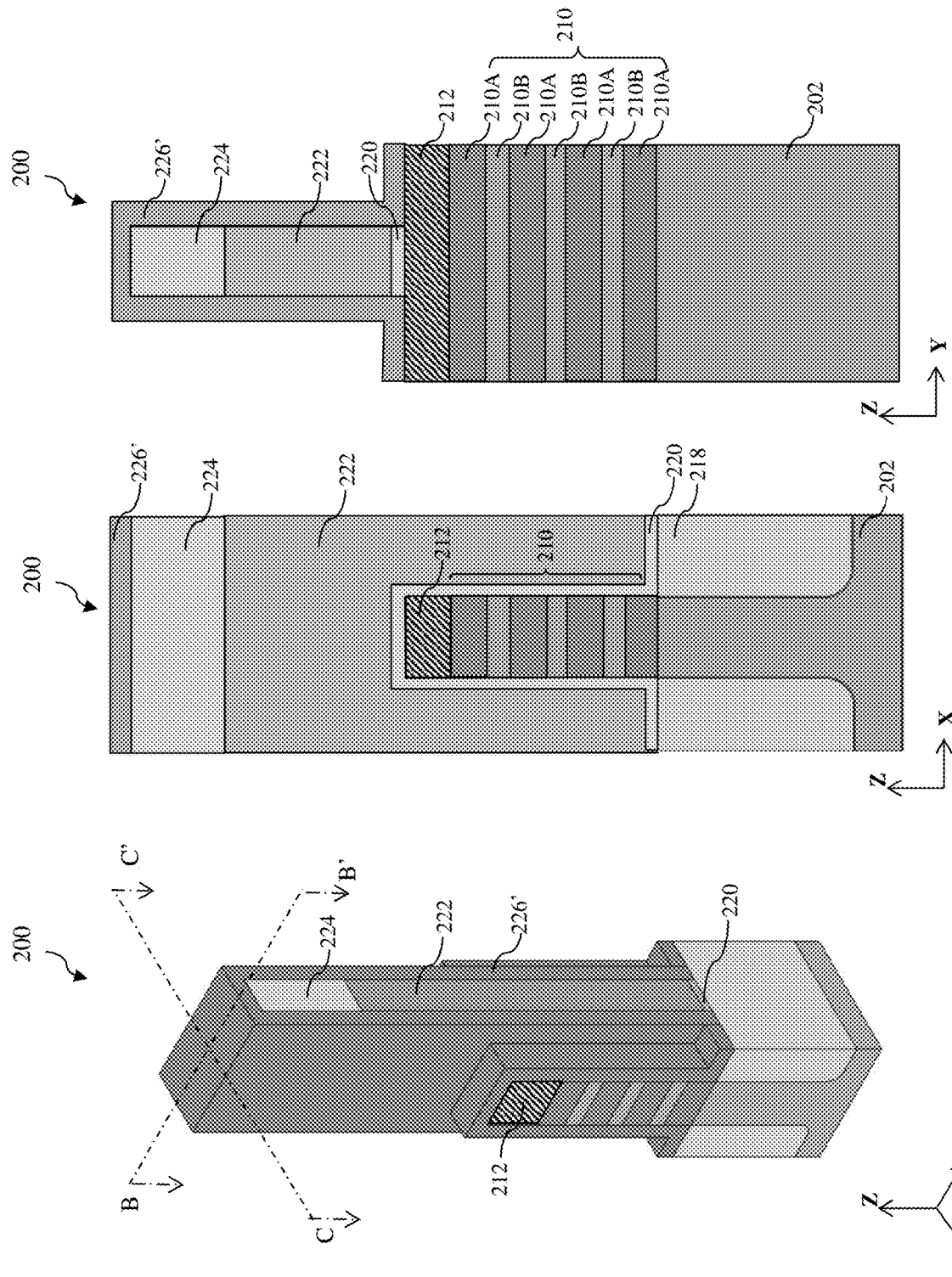

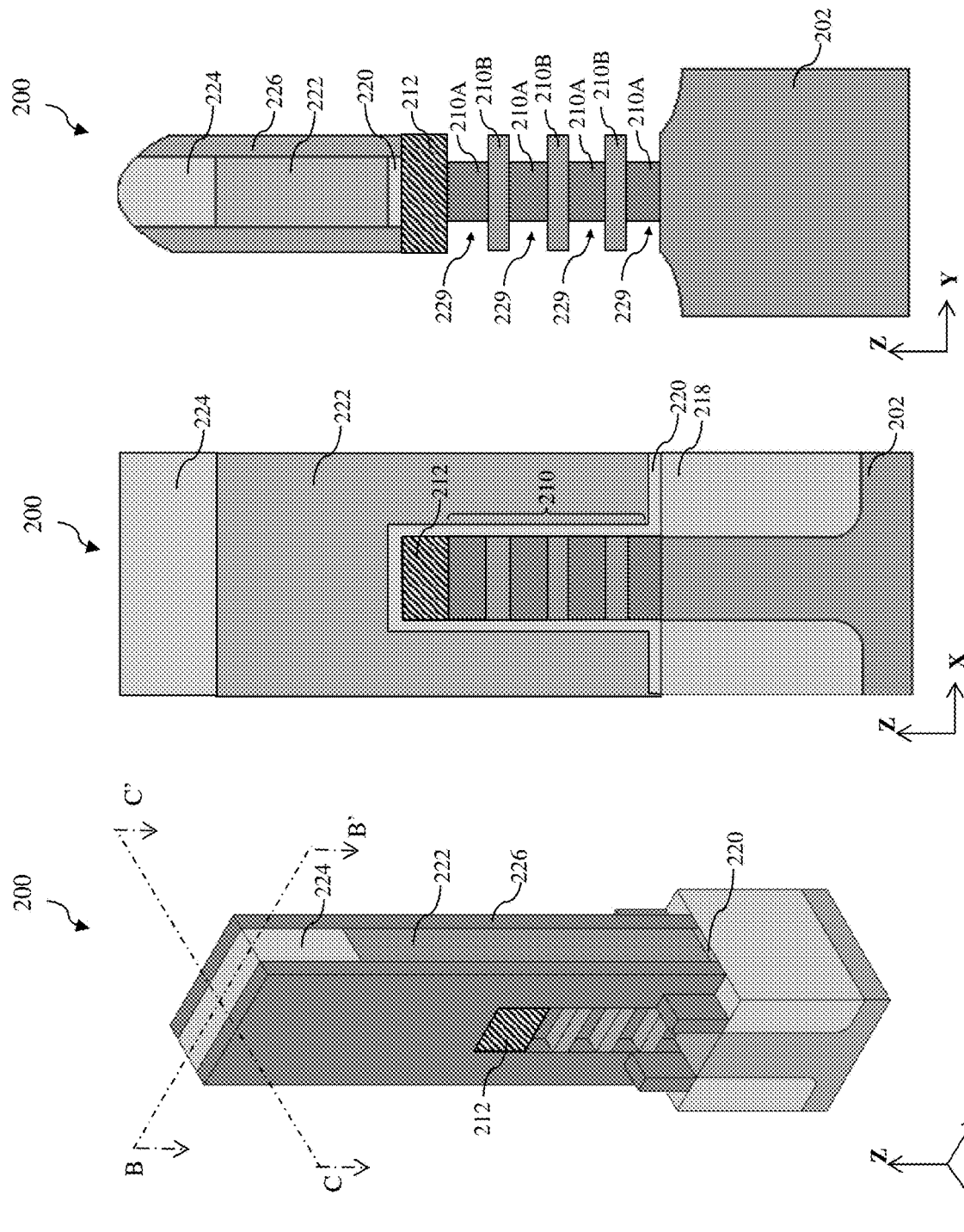

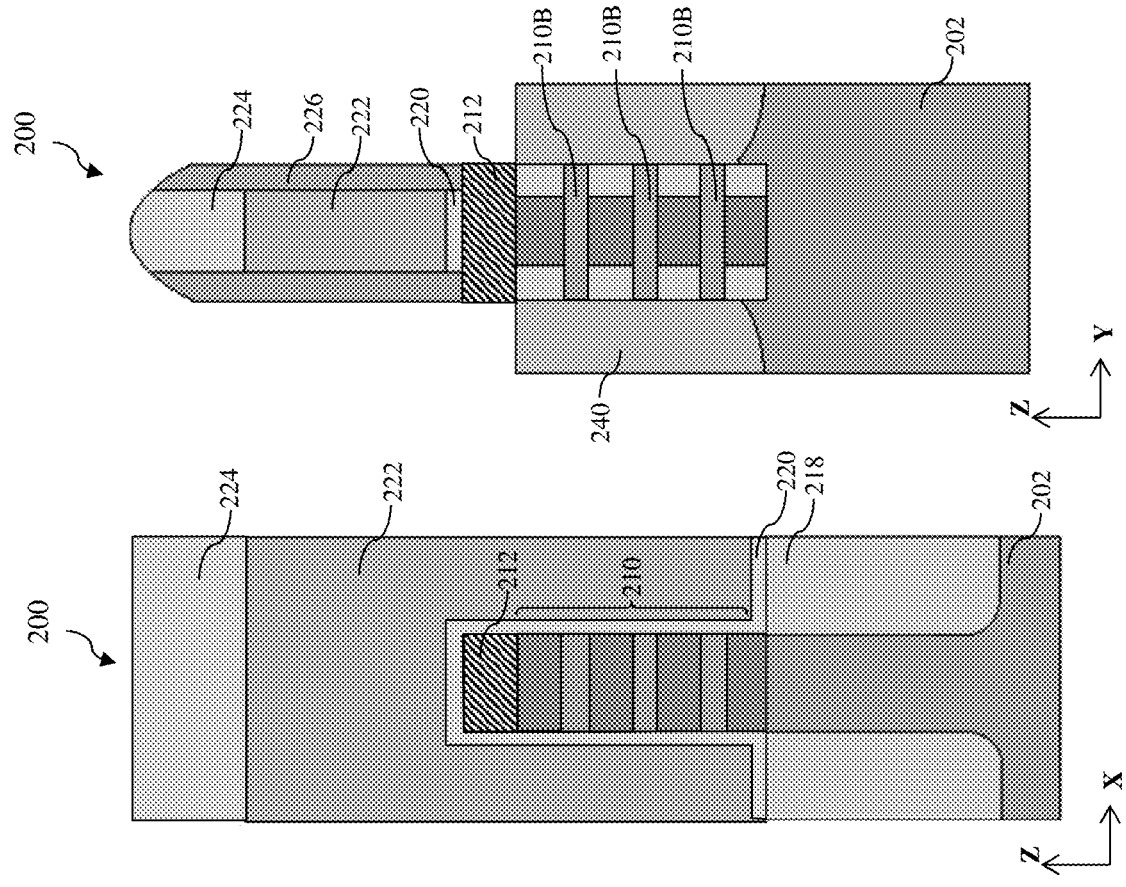
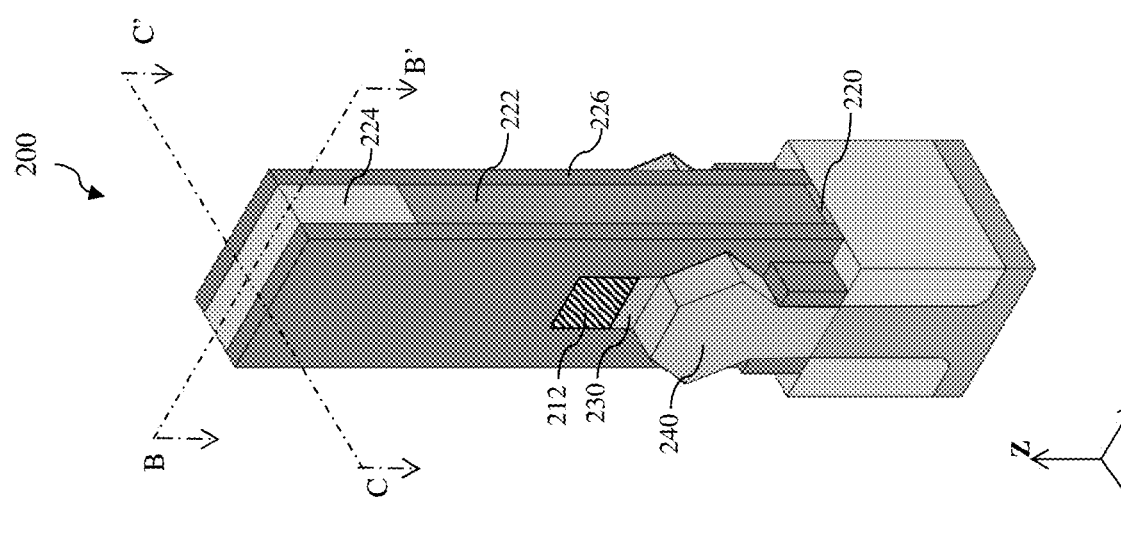
FIG. 12A  FIG. 12B  FIG. 12C

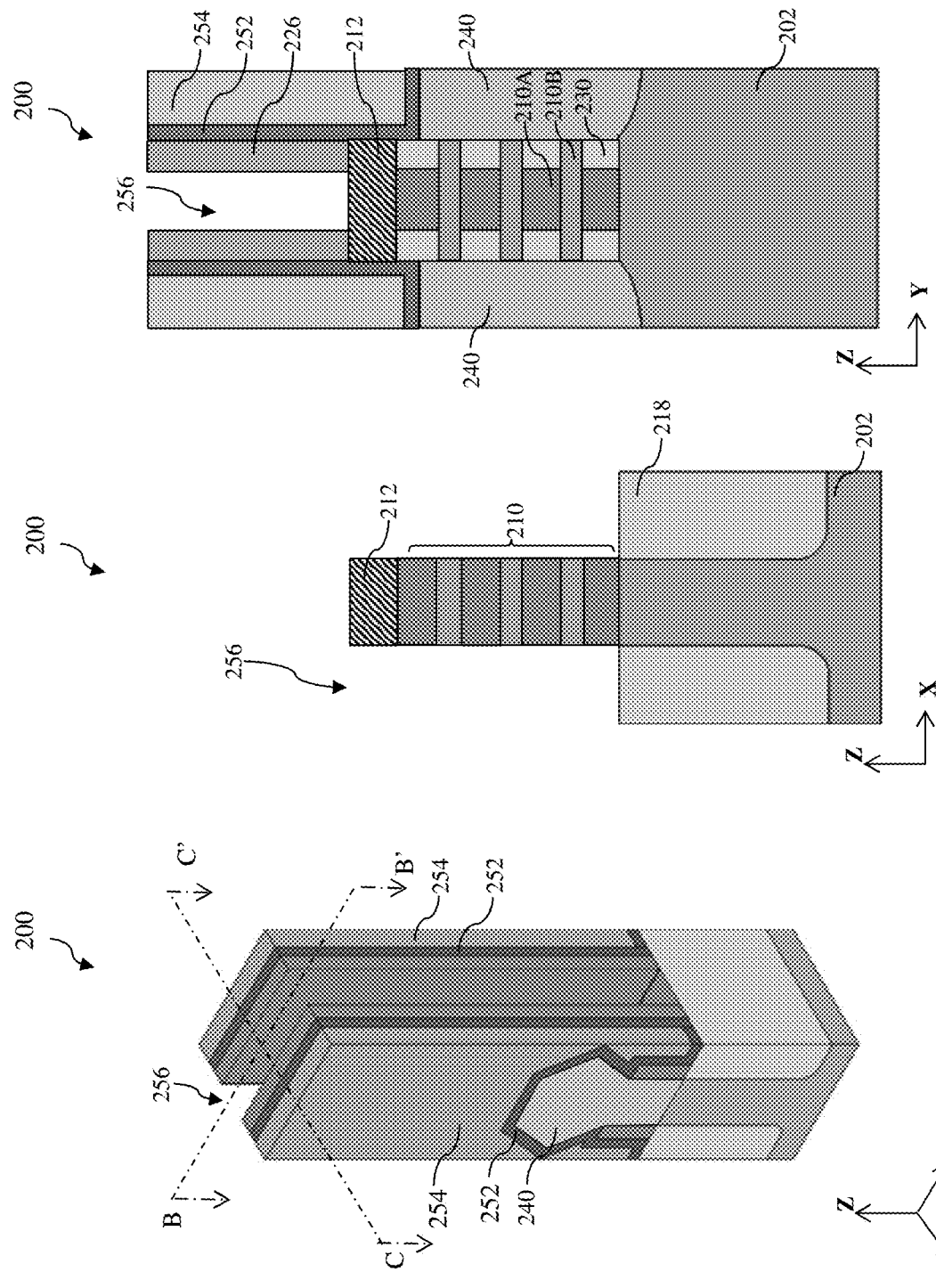

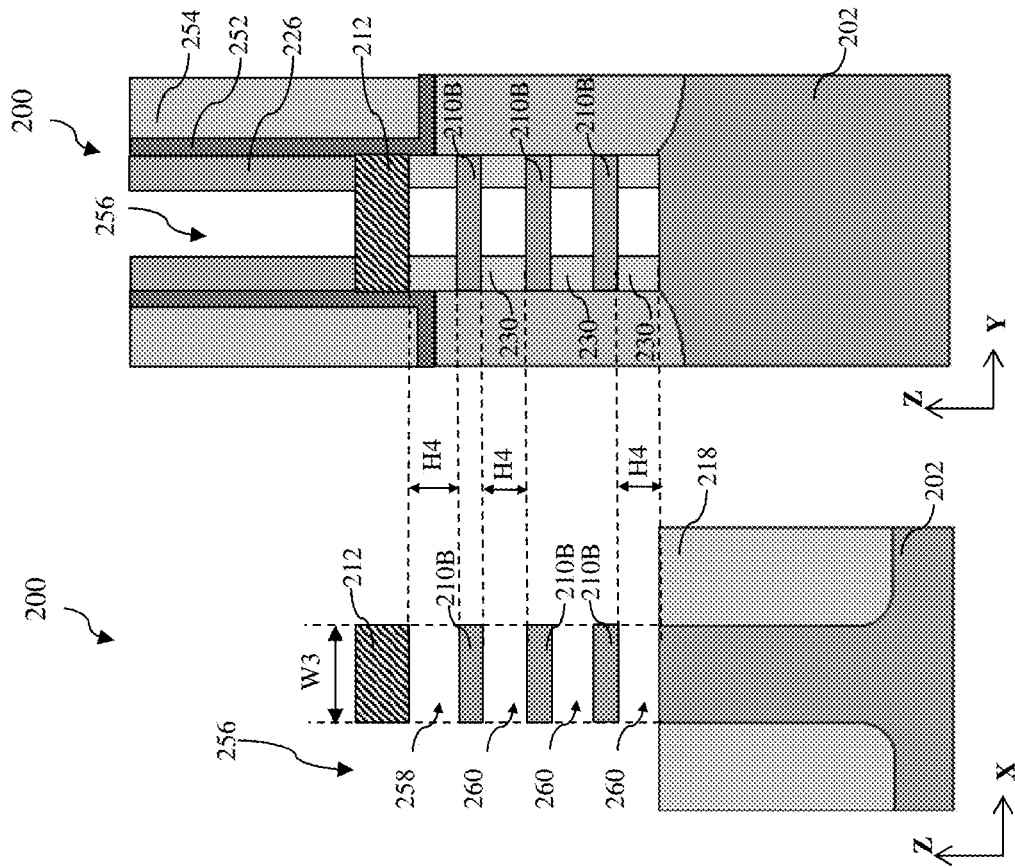
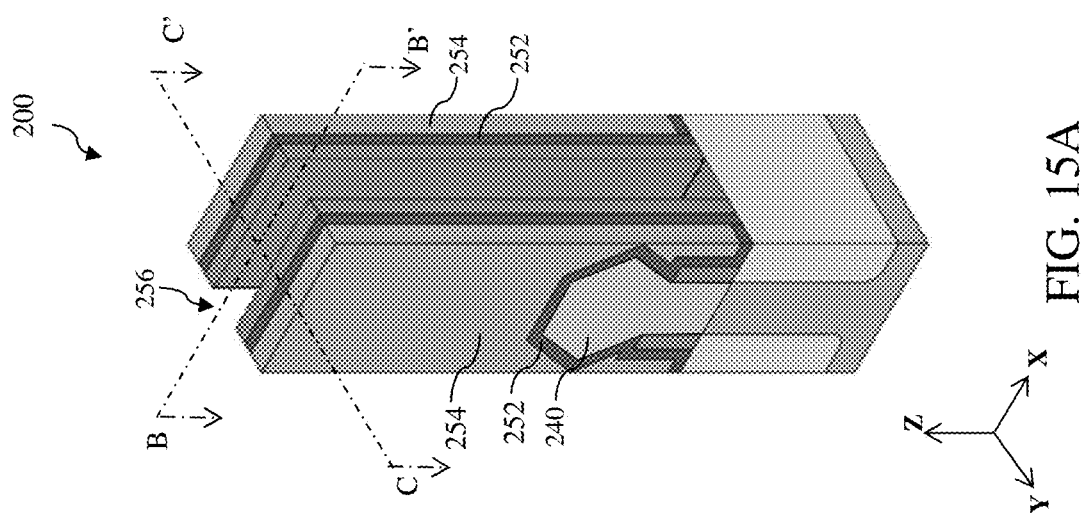
FIG. 15C  FIG. 15B  FIG. 15A

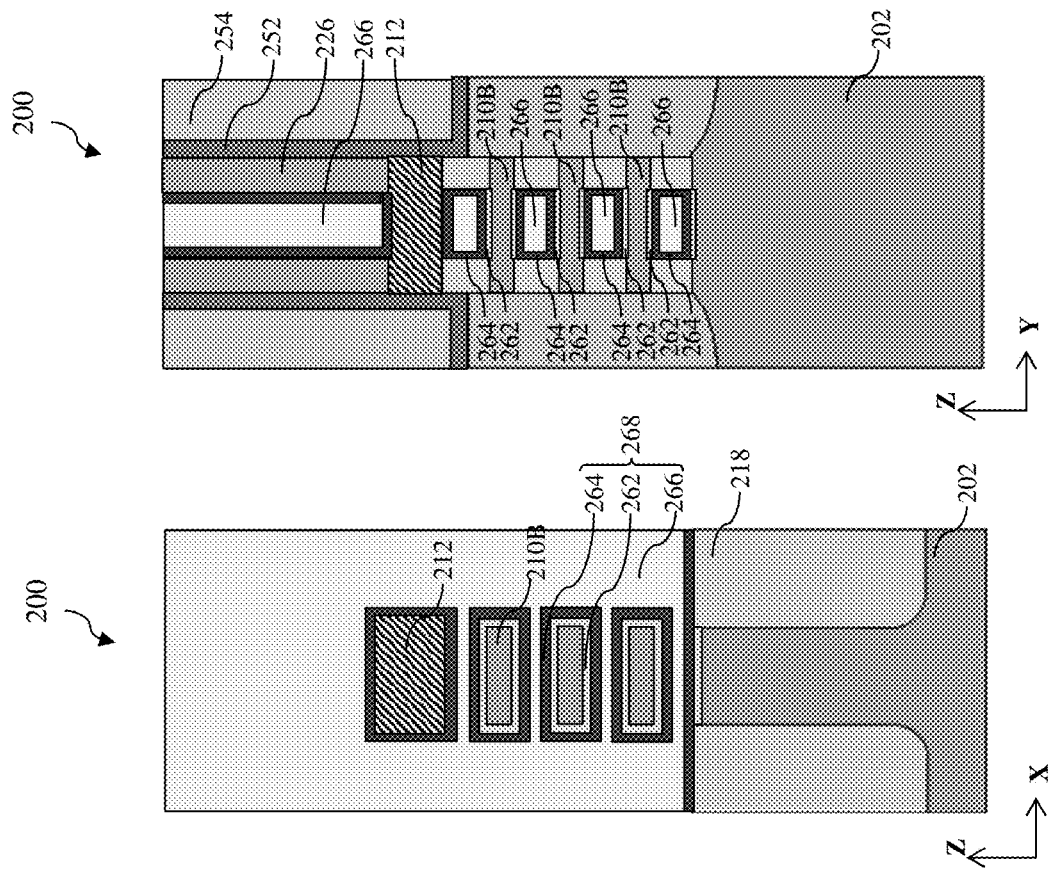
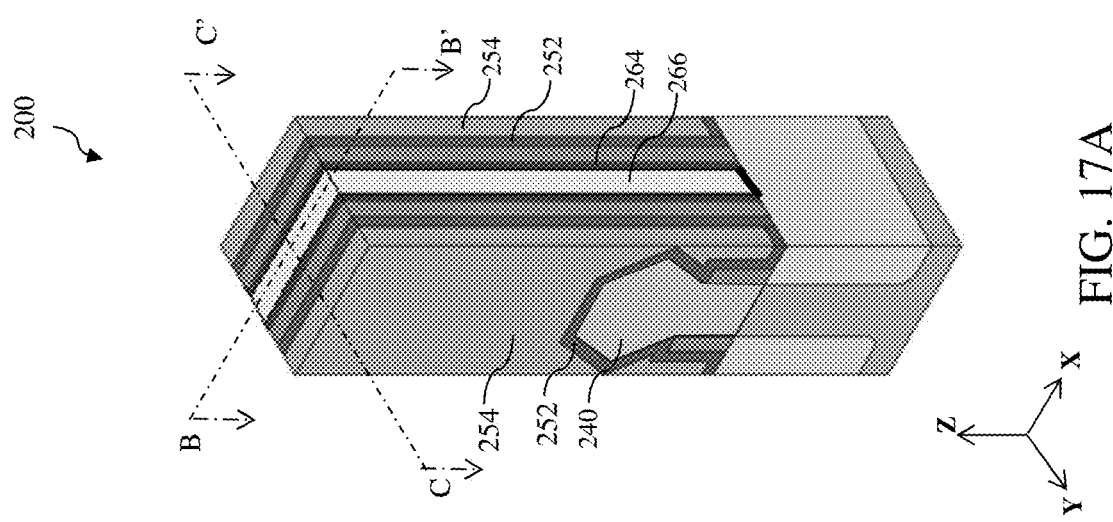
FIG. 17A
FIG. 17B
FIG. 17C

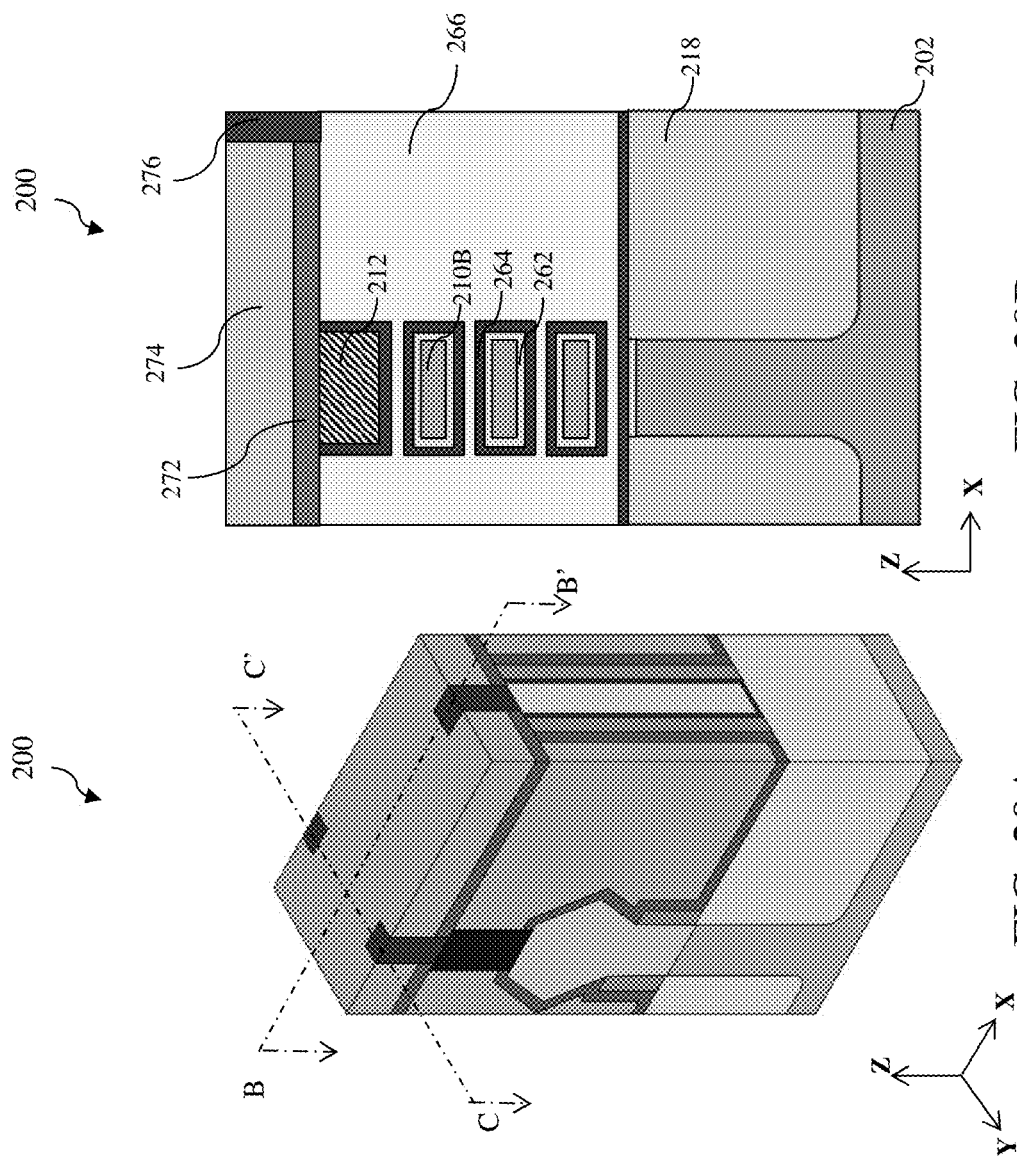

GATE-ALL-AROUND DEVICE WITH PROTECTIVE DIELECTRIC LAYER AND METHOD OF FORMING THE SAME

PRIORITY DATA

The present application is a divisional application of U.S. patent application Ser. No. 16/583,485, filed Sep. 26, 2019, which is herein incorporated by reference in its entirety.

BACKGROUND

Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes and allow aggressive scaling down of transistors. However, fabrication of GAA devices presents challenges. For example, it has been observed that in a conventional GAA device, the topmost channel semiconductor layer may be damaged or cut off during dummy gate etching. This may cause high resistance or even open channel in the topmost channel semiconductor layer, and therefore degrade the GAA device's performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, and 20A illustrate three-dimensional perspective views of an example semiconductor device at intermediate stages of the method of FIG. 1 in accordance with some embodiments of the present disclosure;

FIGS. 2B, 3B, 4B, 5B, 6B, 7B, 8B, 9B, 10B, 11B, 12B, 13B, 14B, 15B, 16B, 17B, 18B, 19B, and 20B illustrate cross-sectional views of the example semiconductor device in a Y-Z plane at intermediate stages of the method of FIG. 1 in accordance with some embodiments of the present disclosure;

FIGS. 2C, 3C, 4C, 5C, 6C, 7C, 8C, 9C, 10C, 11C, 12C, 13C, 14C, 15C, 16C, 17C, 18C, 19C, and 20C illustrate cross-sectional views of the example semiconductor device in an X-Z plane at intermediate stages of the method of FIG. 1 in accordance with some embodiments of the present disclosure;

DETAILED DESCRIPTION

Figure 1:
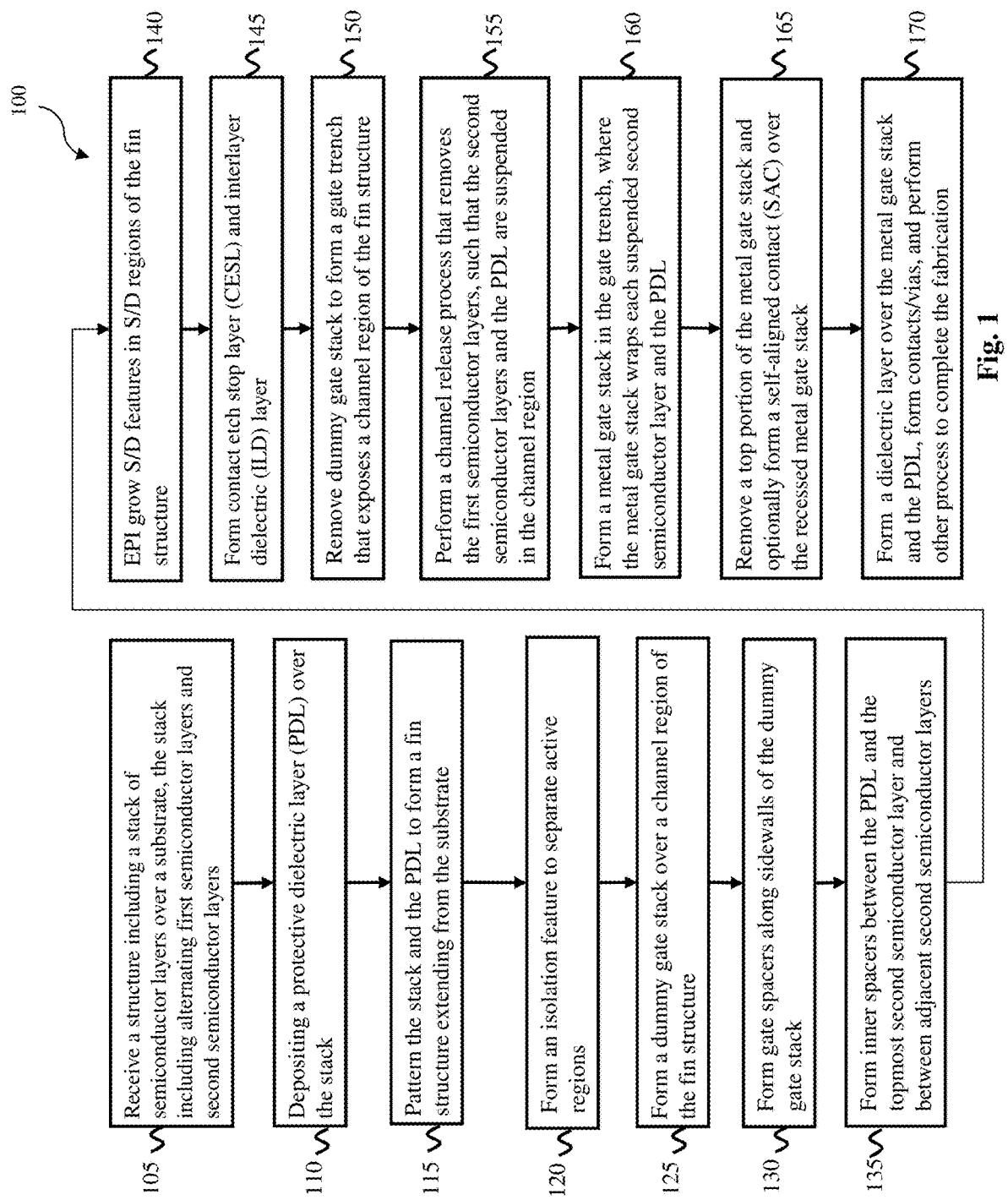
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may include multiple layers of semiconductor material physically separated from one another. In some examples, a gate of the device is disposed above, alongside, and even between the semiconductor layers of the device. This configuration may place more semiconductor material proximate to the gate and thereby improve the control of carriers through the channel region. In turn, GAA devices allow more aggressive gate length scaling for both performance and density improvement than Fin-like Field-Effect-Transistor (FinFET) device.

The present disclosure is generally related to formation of GAA device, wherein a protective dielectric layer is disposed over the topmost channel semiconductor layer. This protective dielectric layer can protect the topmost channel semiconductor layer from being damaged during the dummy gate etching process, and therefore to mitigate the high resistance or open channel issue in a conventional semiconductor device. In addition, the protective dielectric layer can be used as a stop layer to remove the top portion of the metal gate structure such that the gate height variation between different wafers can be reduced. Furthermore, a conventional GAA device usually comprise a thicker portion of metal gate structure over the topmost channel semiconductor layer compare with the portions of the metal gate structure between the channel semiconductor layers. However, with the protective dielectric layer, the GAA device examples in the present disclosure comprise substantially the same metal gate profiles (materials and thicknesses) wrapping around each channel semiconductor layer, including the portion above the topmost channel semiconductor layer. Thereby, the GAA device examples in the present disclosure can provide uniform threshold voltage (Vt) among different channel semiconductor layers, and thus the different channels can turn on/off substantially at the same time.

FIG. 1 illustrates a flow chart of a method 100 for forming a semiconductor device 200 (hereinafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various cross-sectional views and planar top views of device 200 during intermediate steps of method 100. In particular, FIGS. 2A-20A illustrate three-dimensional perspective views of device 200 at intermediate stages of the method of FIG. 1 in accordance with some embodiments of the present disclosure. FIGS. 2B-20B illustrate cross-sectional views of device 200 in a plane B-B' (that is, in an X-Z plane) at intermediate stages of the method of FIG. 1 in accordance with some embodiments of the present disclosure; and FIGS. 2C-20C illustrate cross-sectional views of device 200 in a plane C-C' (that is, in an Y-Z plane) at intermediate stages of the method of FIG. 1 in accordance with some embodiments of the present disclosure.

Device 200 may be an intermediate device fabricated during processing of an integrated circuit (IC), or a portion thereof, that may include static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (110) region), a dummy region, other suitable region, or combinations thereof, of an IC. In some embodiments, device 200 may be a portion of an IC chip, a system on chip (SoC), or a portion thereof. The present disclosure is not limited to any particular number of devices or device regions, or to any particular device configurations. FIGS. 2A-2C to 20A-20C have been simplified for the sake of clarity to better understand the inventive concepts of the present disclosure. Additional features can be added in device 200, and some of the features described below can be replaced, modified, or eliminated in other embodiments of the device 200.

Referring to FIGS. 1, 2A-2C, at operation 105, a device 200 is received. The device 200 includes a substrate 202 and a stack 210 of semiconductor layers over the substrate 202. The stack 210 including alternating semiconductor layers 210A and 210B.

In the depicted embodiment of FIGS. 2A-2C, substrate 202 is a bulk substrate that includes silicon (Si). Alternatively or additionally, the bulk substrate includes another semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 202 may include indium tin oxide (ITO) glass, include silicon on insulator (SOI) substrate, be strained and/or stressed for performance enhancement, include epitaxial regions, doped regions, and/or include other suitable features and layers. Particularly, the substrate 202 may include active regions (such as fin active regions) and isolation structures as well as various active and passive devices, such as p-type field effect transistors (PFETs), n-type FETs (NFETs), multi-gate FETs such as FinFETs and gate-all-around (GAA) FETs, metal-oxide semiconductor field effect transistors (MOSFETs), complementary metal-oxide semiconductor (CMOS) transistors, bipolar transistors, high voltage transistors, high frequency transistors, static random access memory (SRAM) cells, other memory cells, resistors, capacitors, inductors, or combinations thereof.

Still referring to FIGS. 2A-2C, the stack 210 is disposed over the substrate 202. In the depicted embodiments, the stack 210 includes alternating semiconductor layers, such as first semiconductor layers 210A composed of a first semiconductor material and second semiconductor layers 210B composed of a second semiconductor material that is different from the first semiconductor material. The different semiconductor materials composed in alternating semiconductor layers 210A and 210B are provided for different oxidation rates and/or different etch selectivity. For example, the first semiconductor layers 210A comprise silicon germanium (SiGe), and the second semiconductor layers 210B comprise silicon (Si). Thus, the stack 210 is arranged with alternating SiGe/Si/SiGe/Si/SiGe . . . layers from bottom to top. In some embodiments, the material of the topmost semiconductor layer may be or may not be the same as the bottom semiconductor layer in the stack. For example, for a stack that includes alternating SiGe and Si layers, the bottom semiconductor layer comprises SiGe, and the topmost semiconductor layer may be a semiconductor layer comprises Si or SiGe. In the depicted stack 210, the bottom semiconductor layer comprises SiGe, the topmost semiconductor layer also comprises SiGe.

In some embodiments, the second semiconductor layers 210B composed of Si may be undoped or substantially dopant-free. In some embodiments, no intentional doping is performed when forming the second semiconductor layers 210B. In some other embodiments, the second semiconductor layers 210B may be doped with a p-type dopant such as boron or boron compound (B, $^{11}$B or BF2), gallium (Ga), or combinations thereof for a p-type channel, or an n-type dopant such as phosphorus (P, $^{31}$P), arsenic (As), or combinations thereof for an n-type channel. A number of the semiconductor layers in the stack 210 depends on design of the device 200. For example, the stack 210 may comprise one to ten of each type of semiconductor layers 210A or 210B. In some embodiments, different semiconductor layers 210A and 210B in the stack 210 have the same thickness in the Z-direction. In some other embodiments, different semiconductor layers 210A and 210B in the stack 210 have different thickness. In the depicted embodiment, each semiconductor layers 210A has a thickness H1 in the Z-direction, and each semiconductor layers 210B has a thickness H2 in the Z-direction. The height H1 or the height H2 ranges from about 3 nanometers (nm) to about 15 nm, respectively.

The stack 210 including the alternating semiconductor layers 210A and 210B are formed over the substrate 202 using any suitable process. In some embodiments, the semiconductor layers 210A and/or 210B are formed by suitable epitaxy process, such as Molecular beam epitaxy (MBE) process, chemical vapor deposition (CVD) (for example, metal organic CVD (MOCVD)) process, and/or other suitable epitaxial growth processes.

Now referring to FIGS. 1, 3A-3C and 4A-4C, at operation 110, a protective dielectric layer (PDL) 212 is formed over the stack 210. Referring to FIGS. 3A-3C, the PDL 212 is deposited over the topmost semiconductor layer (for example, the topmost SiGe layer 210A) of the stack 210. In some embodiments, the PDL 212 includes a dielectric material, such as hafnium oxide (HfO$_2$), hafnium silicon oxide (HfSiO), hafnium zirconium oxide (HfZrO), zirconium dioxide (ZrO$_2$), silicon oxy nitride (SiON), silicon nitride (SiN), silicon carbonitride (SiCN), silicon oxy carbide (SiOC), silicon oxy carbonitride (SiOCN), other dielectric material, or combinations thereof. In some embodiments, the PDL 212 has a thickness H3 in the Z-direction. The thickness H3 of the PDL 212 is controlled such that the parasitic capacitance between the metal gate and the S/D contact does not increase too much. For example, the thickness H3 is about 2-30 nm. In the depicted embodiment, the thickness H3 of the PDL 212 is substantially uniform throughout the entire layer. In some embodiments, the PDL 212 is deposited by any suitable process, for example, CVD, physical vapor deposition (PVD), atomic layer deposition (ALD), other deposition process, or combinations thereof.

Still at operation 110, after the deposition of the PDL 212, a hard mask layer 214 is formed over the PDL 212. In some embodiments, the hard mask layer 214 includes any suitable material, for example, silicon oxide (SiO), silicon oxy carbide (SiOC), silicon carbide (SiC), silicon carbonitride (SiCN), silicon nitride (SiN), silicon oxy carbonitride (SiOCN), other suitable material, or combinations thereof. The hard mask layer 214 may be deposited over the PDL 204 by a suitable deposition process including, PVD, CVD, ALD, spin on, other deposition process, or combinations thereof.

Figure 4C:
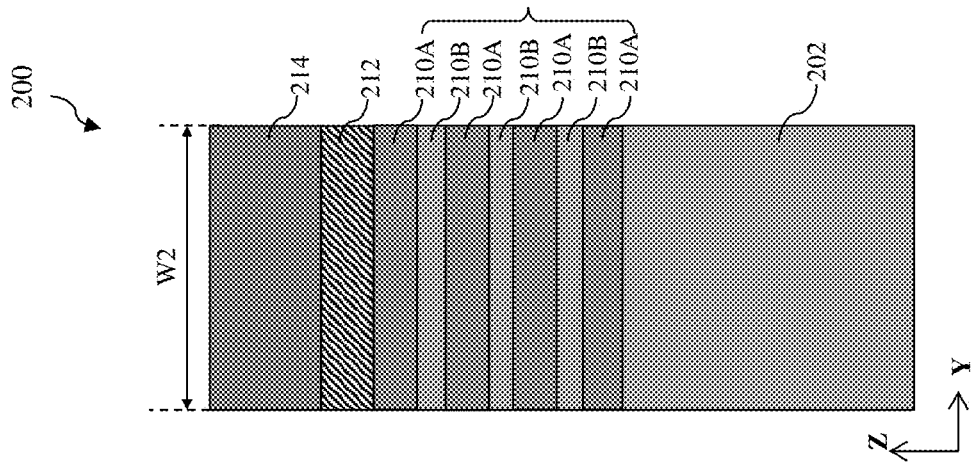
Figure 4B:
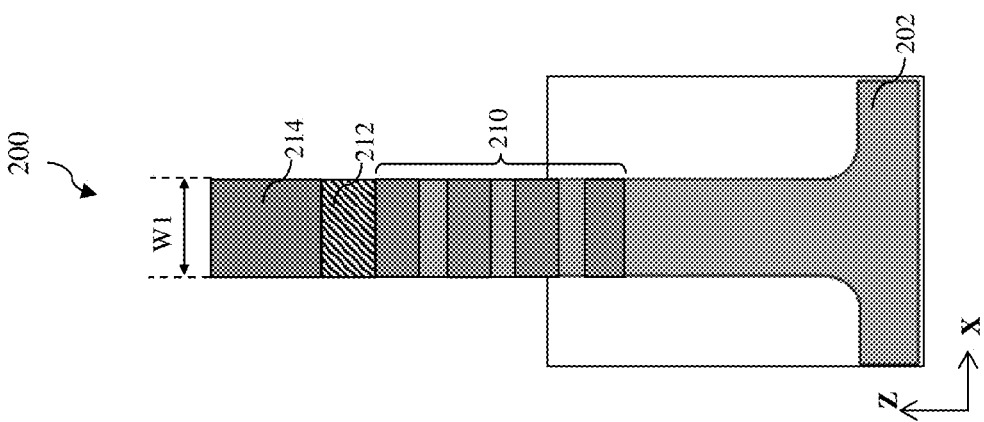
Figure 4A:
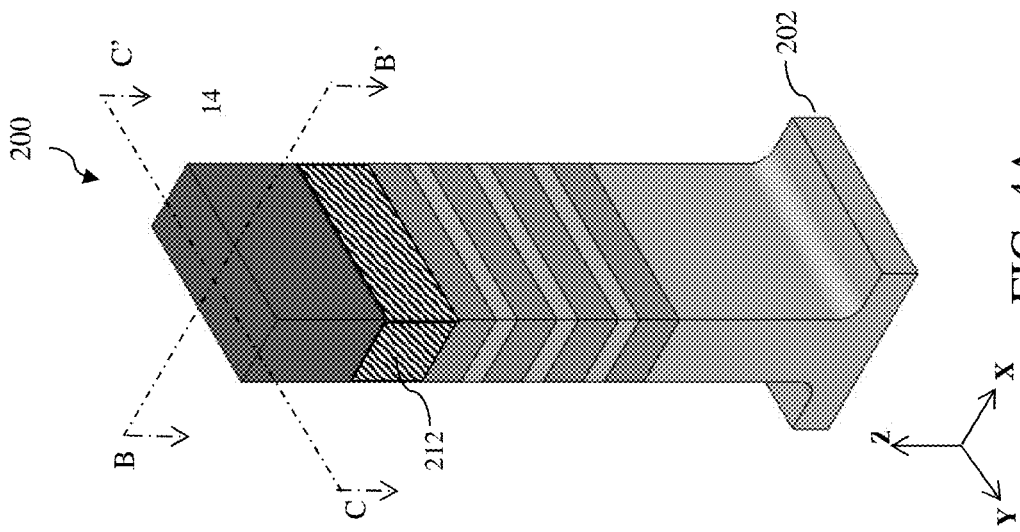

Referring to FIGS. 4A-4C, at operation 115, a top portion of the substrate 202, the stack 210 (including the alternating semiconductor layers 210A and 210B), and the PDL 212 are patterned to form a fin structure extending from the substrate 202. Operation 115 includes several steps. For example, a patterned photoresist layer is formed over the hard mask layer 214. The photoresist layer is patterned such that a portion of the hard mask layer 214 over the stack 210 is exposed from the photoresist layer. In a next step, the hard mask layer 214 is etched through the photoresist layer to form a patterned hard mask layer. The patterned hard mask layer is then used as a mask to etch the PDL 212, the stack 210, and the top portion of the substrate 202 to form a fin structure extending from the substrate 202. As depicted in FIGS. 4A-4C, the substrate 202 now includes a patterned fin shape top portion and an un-patterned bottom portion. The fin structure includes the patterned PDL 212, the stack 210, and the fin shape top portion of the substrate 202. A width W1 of the PDL 212 in the X-direction is substantially equal to the width of the semiconductor layers 210A and 210B in the X-direction. A width W2 of the PDL 212 in the Y-direction (i.e. the gate length direction) is substantially equal to the width of the semiconductor layers 210A and 210B in the Y-direction. The fin structure defines the active regions of the device 200. The etching processes to form the fin structure may include one or more dry etching processes, wet etching processes, and other suitable etching techniques. Still at operation 115, the hard mask layer 212 is then removed by any suitable process, for example, an etching process or CMP.

Now referring to FIGS. 1 and 5A-5C, at operation 120, an isolation feature 218 is formed to separate the active regions of the device 200. In some embodiments, first, a dielectric material, such as SiO and/or SiN, is deposited over the bottom portion of the substrate 202 along sidewalls of the fin structure. The dielectric material may be deposited by CVD, plasma enhanced CVD (PECVD), PVD, thermal oxidation, or other techniques. Subsequently, the top portion of the dielectric material is recessed (for example, by etching or CMP) to form the isolation feature 218. In some embodiments, a top surface of the isolation feature 218 is co-planar or lower than a bottom surface of the stack 210 (i.e. the bottom surface of the bottom semiconductor layer 210A). In some embodiments, the PDL 212 may be slightly removed during the recessing process to the dielectric material to form the isolation feature 218. The isolation feature 218 isolates various active regions of the device 200.

Figure 6C:
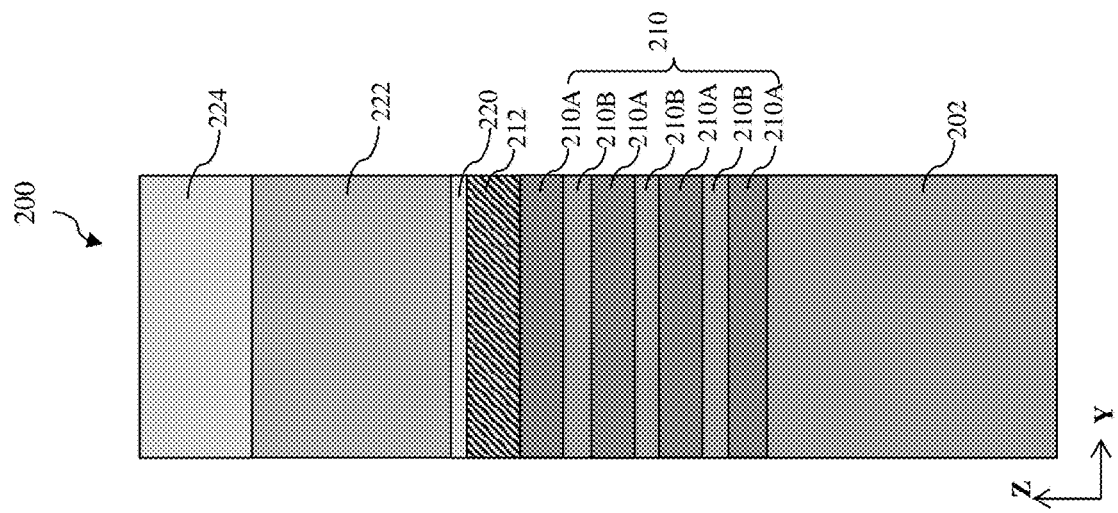
Figure 6B:
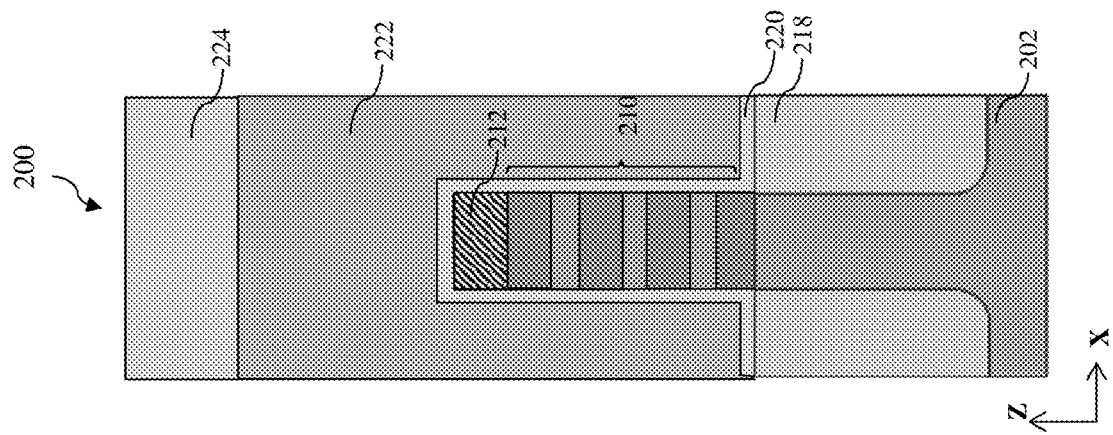
Figure 6A:
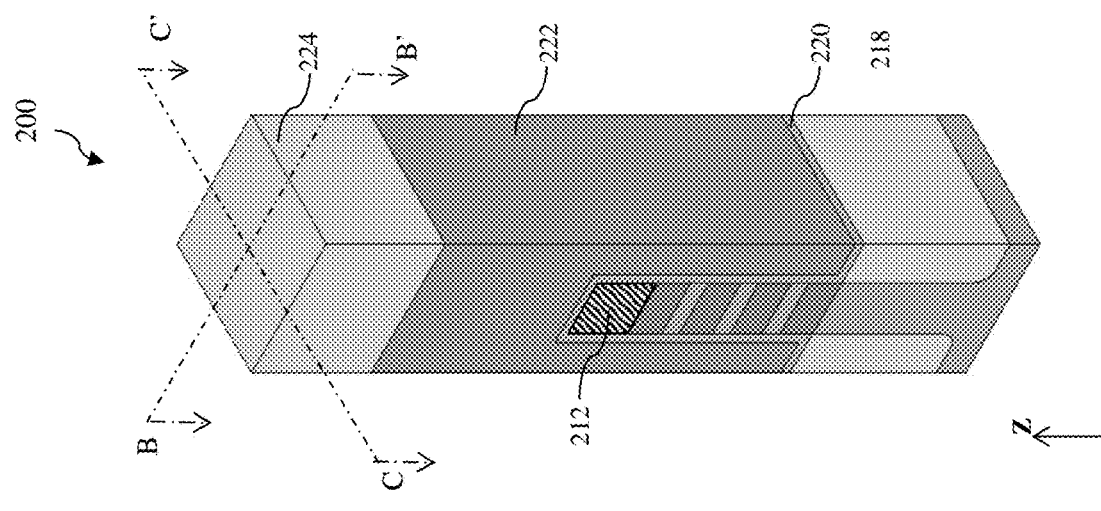

Now referring to FIGS. 1, 6A-6C and 7A-7C, at operation 125, a dummy gate stack 225 is formed over the channel region of the fin structure. In FIGS. 6A-6C, dummy gate layers are deposited over the PDL 212, the stack 210, and the isolation structure 218. In the depicted embodiment, an interfacial layer 220 is disposed over the PDL 212, the stack 210, and the isolation structure 218 and may include any suitable material, for example, silicon oxide (such as, silicon dioxide (SiO$_2$), silicon oxy nitride (SiON), hafnium silicon oxide (HfSiO), or other silicon oxide material). A dummy gate electrode layer 222 is disposed over the interfacial layer 220 and comprises polysilicon (poly). The dummy gate electrode layer 222 can be a single dielectric layer or multiple layers. A hard mask layer 224 is disposed over the dummy gate electrode 222 and may include any suitable material, for example SiO, SiN, or combinations thereof. A deposition process may be performed to form the interfacial layer 220, the dummy gate electrode layer 222, and the hard mask layer 224 over the substrate. The deposition process includes CVD, PVD, ALD, plating, other suitable methods, or combinations thereof.

In FIGS. 7A-7C, the dummy gate layers are patterned to form a dummy gate stack 225 that includes the interfacial layer 220, the dummy gate electrode 222, and the hard mask layer 224. A lithography patterning and etching process is performed to pattern the interfacial layer 220, the dummy gate electrode layer 222, and the hard mask layer 224 to form the dummy gate stack 225 over the channel region of the fin structure. The lithography patterning processes include resist coating (for example, spin-on coating), soft baking, mask aligning, exposure, post-exposure baking, developing the resist, rinsing, drying (for example, hard baking), other suitable processes, or combinations thereof. The etching processes include dry etching, wet etching, other etching methods, or combinations thereof. In the depicted embodiment, the dummy gate stack 225 is disposed over a channel region of the fin structure, thereby interposing respective S/D regions of the fin structure. The dummy gate stack 225 serves as a placeholder for subsequently forming a metal gate stack. The dummy gate stack 225 extends along the X-direction and may traverse more than one fin structure (not shown).

Now referring to FIGS. 1, 8A-8C, and 9A-9C, at operation 130, gate spacers 226 are formed along sidewalls of the dummy gate stack 225. First, as depicted in FIGS. 8A-8C, a spacer layer 226' is formed conformally over the substrate, including the isolation structure 218, the dummy gate stack 225, and the fin structure including the PDL 212 and the stack 210. In some embodiments, the spacer layer 226' may include silicon, oxygen, carbon, nitrogen, other suitable material, or combinations thereof (for example, SiO, SiN, SiON, SiCN, SiOC, SiOCN, etc.). In some examples, the spacer layer 226' includes a multi-layer structure, such as a first dielectric layer that includes SiN and a second dielectric layer that includes SiO. In some embodiments, a thickness of the spacer layer 226' is about 1-10 nm. The spacer layer 226' may be formed by any suitable method, such as ALD, CVD, PVD, other suitable methods, or combinations thereof. In the depicted embodiment, the spacer layer 226' is formed by a thermal ALD process. Thereafter, referring to FIGS. 9A-9C, an etching process is performed to the spacer layer 226' to form the spacers 226. The etching process is an anisotropically etching process, such that only portions of the spacer layer 226' in the X-Y plane are removed. Portions of the spacer layer 226' along the Z-direction remains substantially unchanged and form the gate spacers 226. In some embodiments, a thickness of the gate spacer 226 in the X-direction or Y-direction is about 1-10 nm.

Figure 9C:
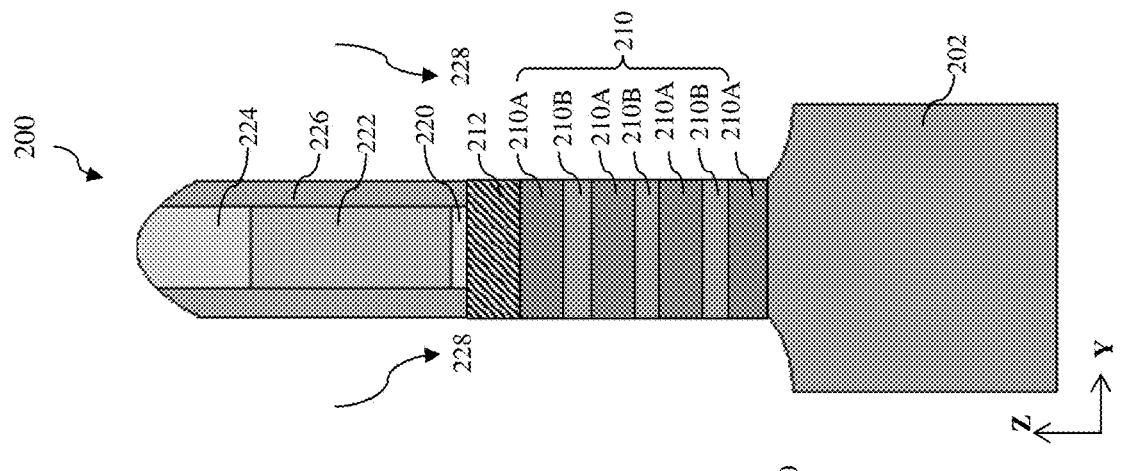
Figure 9B:
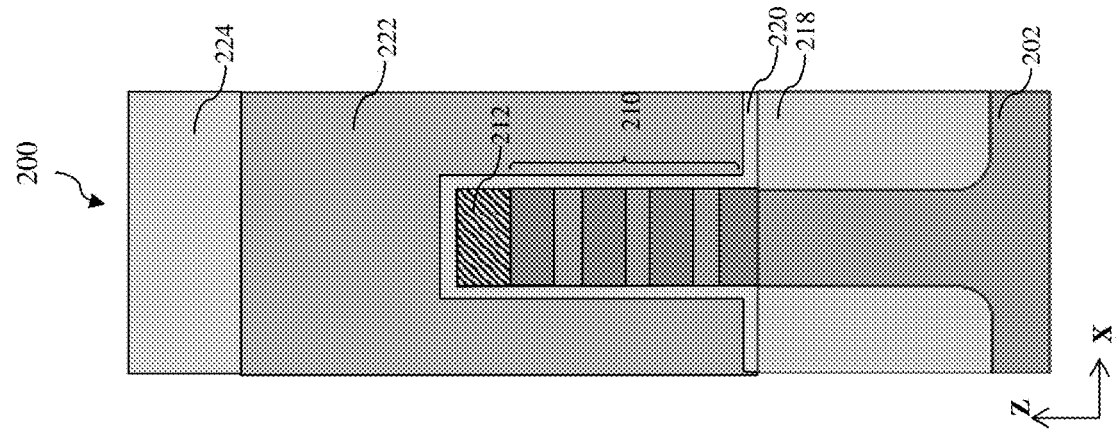
Figure 9A:
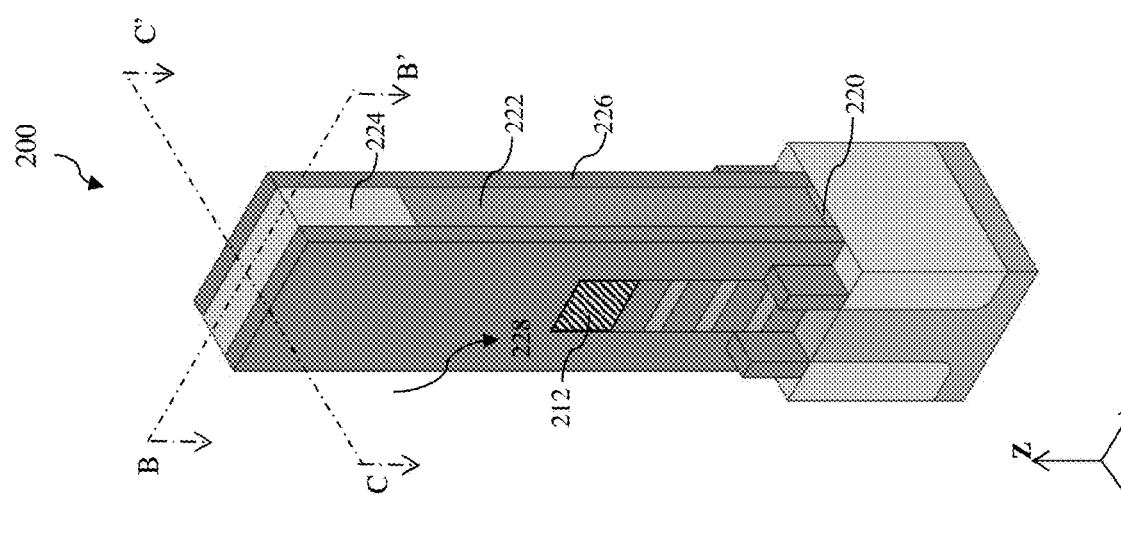

Referring to FIGS. 9A-9C, still at operation 130, another etching process (referred to as S/D etching) is performed to portions of the PDL 212 and the stack 210 in the S/D regions of the fin structure. The S/D etching is performed along the gate spacers 226 to form the S/D trenches 228. The S/D etching process may be a dry etching, a wet etching, or combinations thereof. A time control is performed to the S/D etching process, such that the sidewalls of each semiconductor layers 210A and 210B of the stack 210 are exposed in the S/D trenches. In some embodiments, the top surface of the substrate 202 may be slightly removed during the S/D etching process. As depicted in FIGS. 9A and 9C, the S/D trenches 228 include a sidewall formed by the sidewalls of the gate spacer 226, the PDL 212, and the stack 210 (including alternating semiconductor layers 210A and 210B), and a bottom surface formed by a top surface of the substrate 210.

Now referring to FIGS. 1, 10A-10C, and 11A-11C, at operation 135, inner spacers 230 are formed between the PDL 212 and the topmost semiconductor layer 210B, and between the adjacent semiconductor layers 210B. Referring to FIGS. 10A-10C, portions of the semiconductor layers 210A exposed in the S/D trenches 228 are selectively removed by a suitable etching process to form gaps 229 between the PDL 212 and the topmost semiconductor layer 210B and between the adjacent semiconductor layers 210B, such that portions (edges) of the semiconductor layers 210B are suspended in the S/D trenches 228. An extent of which the semiconductor layers 210B are removed may be controlled by duration of the etching process. In some embodiments, an extent of the selective removing of the semiconductor layers 210A is about 2 to 15 nm. As discussed above, in the depicted embodiment, the semiconductor layers 210A include SiGe, the semiconductor layers 210B include Si. Accordingly, the etching process at operation 135 selectively removes portions of the SiGe layers 210A without removing or substantially removing the Si layers 210B. In some embodiments, the etching process is a selective isotropic etching process (e.g., a selective dry etching process or a selective wet etching process). In some embodiments, the selective wet etching process may include a hydro fluoride (HF), fluoride ($F_2$) or ammonium hydroxide ($NH_4OH$) etchant. In the depicted embodiment where the semiconductor layers 210A comprise SiGe and the semiconductor layers 210B comprise Si, the selective removal of the SiGe layers may include a SiGe oxidation process followed by a SiGeOx removal. For example, the SiGe oxidation process may include forming and patterning various masking layers such that the oxidation is controlled to the SiGe layers. In other embodiments, the SiGe oxidation process is a selective oxidation due to the different compositions of the semiconductor layers 210A and 210B. In some embodiments, the SiGe oxidation process may be performed by exposing the device 200 to a wet oxidation process, a dry oxidation process, or a combination thereof. Thereafter, the oxidized semiconductor layers, which include SiGeOx, are removed by an etchant such as $NH_4OH$ or diluted HF.

Figures 11A, 11B, 11C:
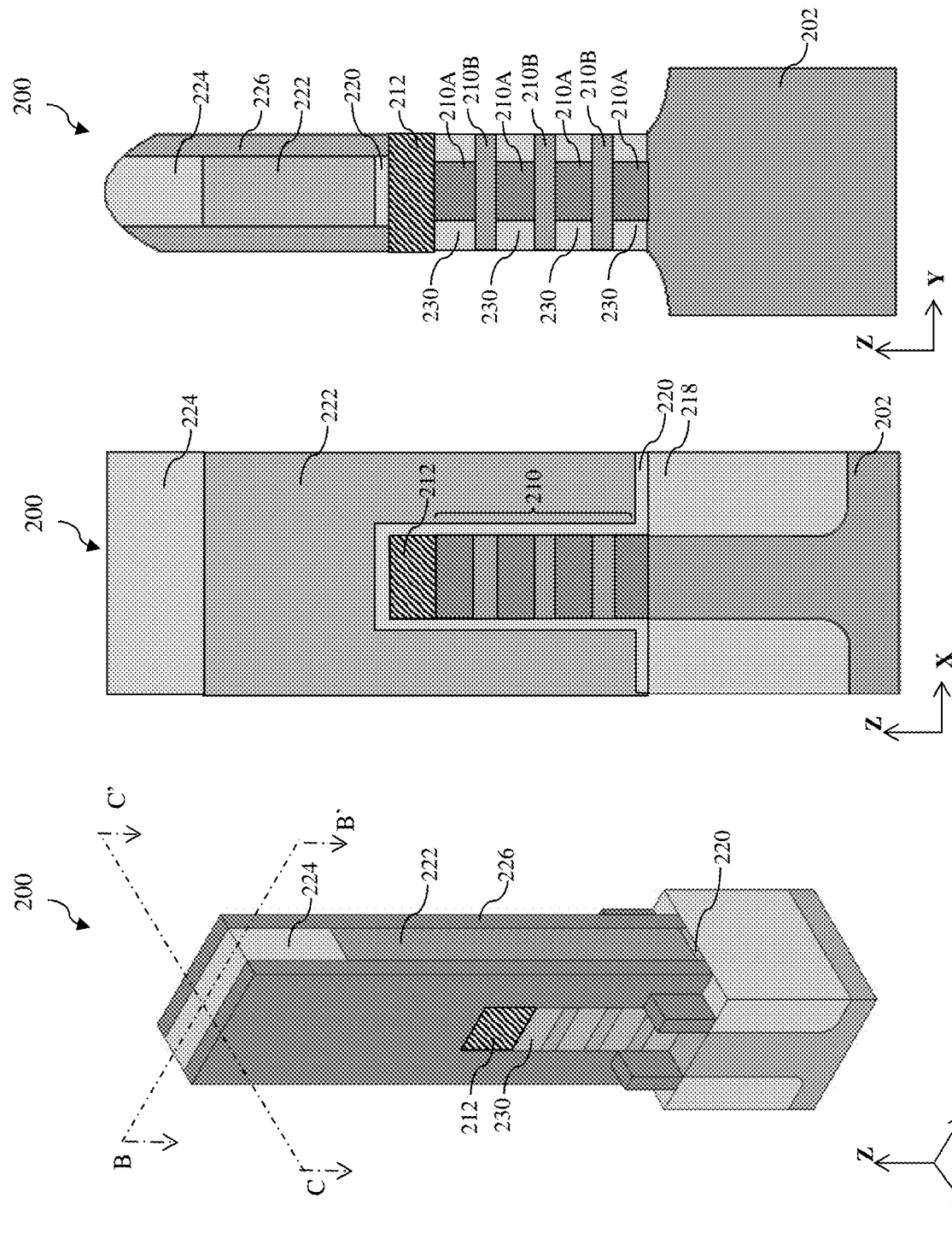

Next, referring to FIGS. 11A-11C, inner spacers 230 are formed in the gaps 229 between the PDL 212 and the topmost semiconductor layer 210B and between the semiconductor layers 210B. A material of the inner spacers 230 may be similar to the material of the gate spacers 226. For example, the inner spacers 230 includes SiO, SiON, SiN, SiCN, SiOC, SiOCN, or combinations thereof. In some embodiments, the inner spacer material is deposited in the S/D trenches 228 as well as the gaps 229 by any suitable deposition process, for example CVD, PVD, ALD, or combinations thereof. Then, the inner spacer material is removed along sidewalls of the gate spacers 226 until the sidewalls of the semiconductor layers 210B are exposed in the S/D trenches 228. The remained inner spacer material forms the inner spacers 230. In some embodiments, the width of the inner spacers 230 in the Y-direction is about 2-15 nm which is the selective etching extent of the semiconductor layers 210A. Therefore, as depicted in FIGS. 11A and 11C, the S/D trenches 228 now include a sidewall formed by sidewalls of the gate spacers 226, the PDL 212, the semiconductor layers 210B, and the inner spacers 230.

Now referring to FIGS. 1, 12A-12C, at operation 140, epitaxial S/D features 240 are grown in the S/D regions of device 200. In various embodiments, the epitaxial S/D features 240 may include a semiconductor material such as silicon (Si) or germanium (Ge); a compound semiconductor such as silicon germanium (SiGe), silicon carbide (SiC), gallium arsenide (GaAs), gallium phosphide (GaP), indium phosphide (InP), indium arsenide (InAs), indium antimonide (InSb); an alloy semiconductor such GaAsP, AlInAs, AlGaAs, InGaAs, GaInP, and/or GaInAsP; or combinations thereof. A top surface of the epitaxial S/D features 240 is co-planar or higher than a top surface of the topmost Si layer 210B.

An epitaxy process may be implement to epitaxially grow S/D features 240. The epitaxy process may include CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy, other suitable selective epitaxial growth (SEG) processes, or combinations thereof. The epitaxy process can use gaseous and/or liquid precursors. Epitaxial S/D features 240 may be doped with n-type dopants and/or p-type dopants. In some embodiments, epitaxial S/D features 240 are doped with boron, boron difluoride, carbon, other p-type dopant, or combinations thereof (for example, forming an Si:Ge:B epitaxial S/D feature or an Si:Ge:C epitaxial S/D feature). In some embodiments, epitaxial S/D features 240 are doped with phosphorous, arsenic, other n-type dopant, or combinations thereof (for example, forming an Si:P epitaxial S/D feature, an Si:C epitaxial S/D feature, or an Si:C:P epitaxial S/D feature). In some embodiments, epitaxial S/D features 240 may include multiple epitaxial semiconductor layers, and different epitaxial semiconductor layers are different in amount of dopant included therein. In some embodiments, epitaxial S/D features 240 include materials and/or dopants that achieve desired tensile stress and/or compressive stress in the channel regions. In some embodiments, epitaxial S/D features 240 are doped during deposition by adding impurities to a source material of the epitaxy process. In some embodiments, epitaxial S/D features 240 are doped by an ion implantation process subsequent to a deposition process. In some embodiments, annealing processes are performed to activate dopants in epitaxial S/D features 240, such as heavy doped S/D (HDD) regions and/or light doped S/D (LDD) regions.

Figure 13C:
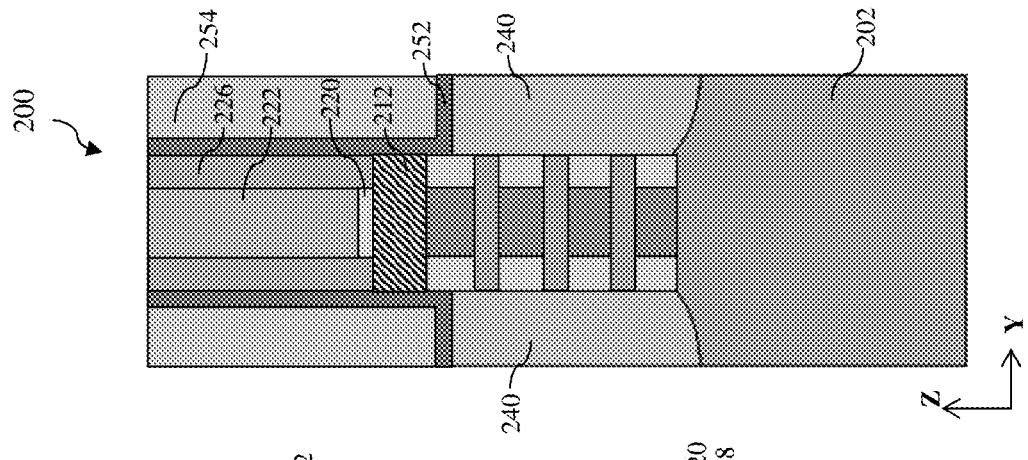
Figure 13B:
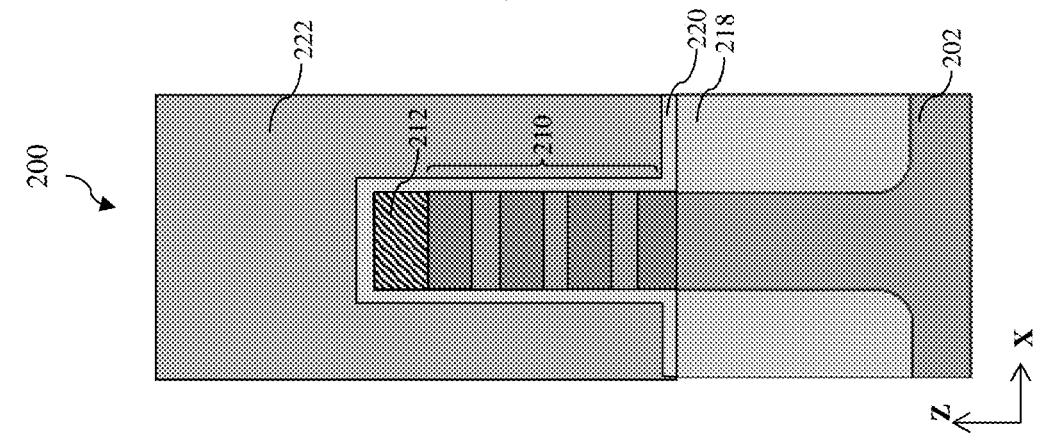
Figure 13A:
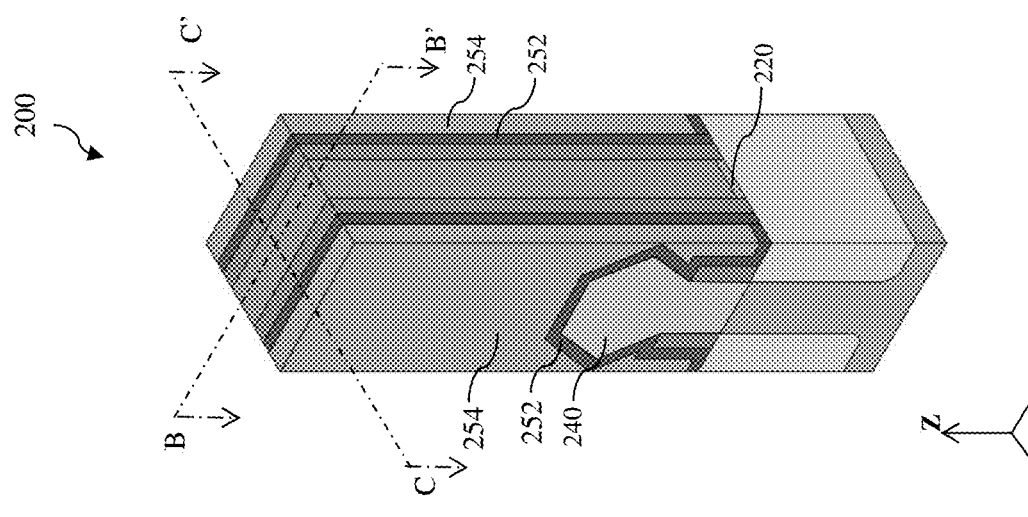

Now referring to FIGS. 1, 13A-13C, at operation 145, a contact etch stop layer (CESL) 252 and an interlayer dielectric (ILD) layer 254 is formed over the device 200. The CESL 252 may include any suitable dielectric material, such as SiO, SiON, SiN, SiCN, SiOC, SiOCN, and may be formed by any suitable method, such as ALD, CVD, PVD, other suitable methods, or combinations thereof. As illustrated in FIGS. 13A and 13C, the CESL 252 is disposed along the gate spacers 226 and covers the isolation feature 218 and the epitaxial S/D features 240. In some embodiments, the CESL 252 has a conformal profile over the epitaxial S/D features 240 (e.g., having about the same thickness on top and sidewall surfaces of epitaxial S/D features 240). In some embodiments, the CESL 252 has a thickness of about 1 to 10 nm. The ILD layer 254 is formed over the CESL 252. The ILD layer 254 includes a low-k dielectric material, such as tetraethylorthosilicate (TEOS), un-doped silicate glass, or doped silicon oxide (SiO) such as borophosphosilicate glass (BPSG), fused silica glass (FSG), phosphosilicate glass (PSG), boron doped silicon glass (BSG), other suitable dielectric materials, or combinations thereof. The ILD layer 254 may include a multi-layer structure having multiple dielectric materials and may be formed by a deposition process such as CVD, flowable CVD (FCVD), spin-on-glass (SOG), other suitable methods, or combinations thereof. In some embodiments, operation 145 further includes performing a CMP process to planarize a top surface of the device 200. The CMP process also removes the hard mask layer 224 of the dummy gate stack 225. As a result, dummy gate electrode 222 (poly layer) is exposed from a top surface of the device 200.

Now referring to FIGS. 1 and 14A-14C, at operation 150, the dummy gate stack 225 (including the dummy gate electrode 222 and the interfacial layer 220) is removed to form a gate trench 256 that exposes the channel region of the fin structure. In some embodiments, removing the dummy gate stack 225 (including the dummy gate electrode 222 and the interfacial layer 220) includes one or more etching processes, such as wet etching, dry etching, reactive-ion etching (RIE), or other etching techniques. In a conventional semiconductor device, without the protection of the PDL 212, the topmost channel semiconductor layer of the stack 210 may be damaged or cut off, therefore may cause high resistance or even channel open for the semiconductor device. However, in the present disclosure, the PDL 212 is formed over the stack 210, thereby can protect the semiconductor layers of the stack 210 from being damaged during the dummy gate removing process. Referring to FIGS. 14A-14C, after removing the dummy gate stack, the PDL 212 and the alternating semiconductor layers 210A and 210B of the stack 210 are exposed in the gate trench 256.

Now referring to FIGS. 1 and 15A-15C, at operation 155, a channel release process is performed such that the semiconductor layers 210A are removed from the gate trench 256. As a result, the PDL 212 and the semiconductor layers 210B are suspended in the channel region of the fin structure. The suspended semiconductor layers 210B are collectively referred to as a nanostructure. And, each of the semiconductor layers 210B is referred to as a channel semiconductor layer. In some embodiments, the channel semiconductor layers 210B are slightly etched or not etched depending on the design of the device 200. For example, semiconductor layers 210B may be slightly etched to form as a wire-like shape (for nanowire GAA transistors); semiconductor layers 210B may be slightly etched to form as a sheet-like shape (for nanosheet GAA transistors); or, semiconductor layers 210B may be slightly etched to form other geometrical shape (for other nanostructure GAA transistors). As depicted in FIG. 15B, the PDL 212 and the suspended semiconductor layers 210 B has a width W3 in the X-direction. In some embodiments, the width W3 is about 5 nm to about 80 nm.

At operation 155, the semiconductor layers 210A are removed by a selective etching process that is tuned to remove only the semiconductor layers 210A while the PDL 212, the semiconductor layers 210B and the inner spacers 230 remain substantially unchanged. The selective etching may be a selective wet etching, a selective dry etching, or a combination thereof. In some embodiments, the selective wet etching process may include a HF or $NH_4OH$ etchant. In some embodiments, the selective removal of semiconductor layers 210A may include an oxidation process (for example, to form oxidized semiconductor layers 210A comprising SiGeOx) followed by an oxidation removal (for example, SiGeOx removal). Referring to FIGS. 15B and 15C, the space 258 between the PDL 212 and the topmost channel semiconductor layer 210B and the spaces 260 between the adjacent channel semiconductor layers 210B are substantially the same size. In other words, a height H4 of the space 258 is substantially the same as the height H4 of the spaces 260. In some embodiments, the height H4 ranges from about 4-15 nm.

Now referring to FIGS. 1, 16A-16C and 17A-17C, at operation 160, a metal gate stack 268 is formed in the channel region of the fin structure. The metal gate stack 268 includes multiple layers, such as a gate interfacial layer 262 wrapping each channel semiconductor layer 210B, a gate dielectric layer 264 formed over the gate interfacial layer 262, a metal gate electrode 266 formed over the gate dielectric layer 264, other suitable layers, or combinations thereof. The metal gate stack 268 wraps around each suspended channel semiconductor layer 210B as well as the PDL 212 in the channel region of the fin structure.

Figure 16C:
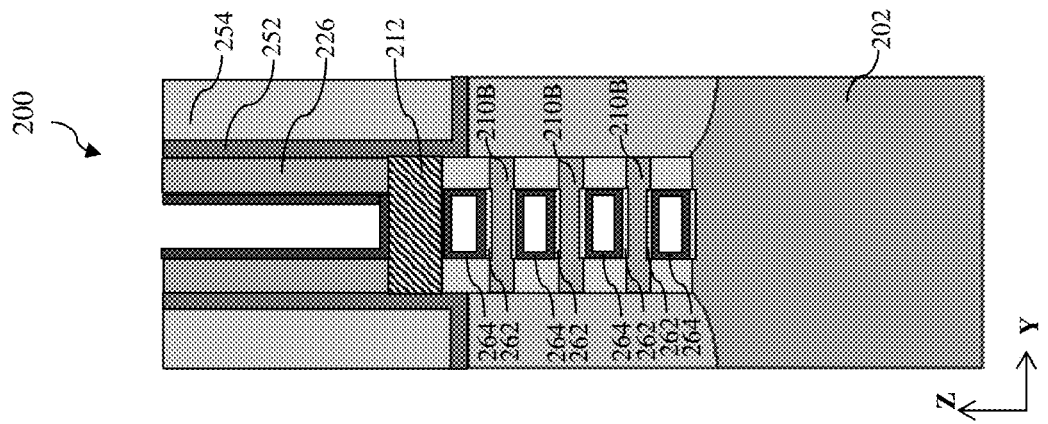
Figure 16B:
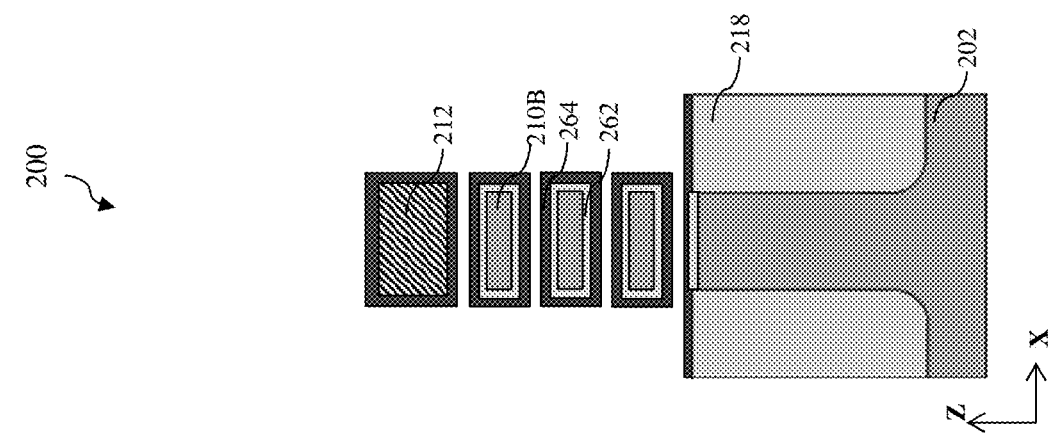
Figure 16A:
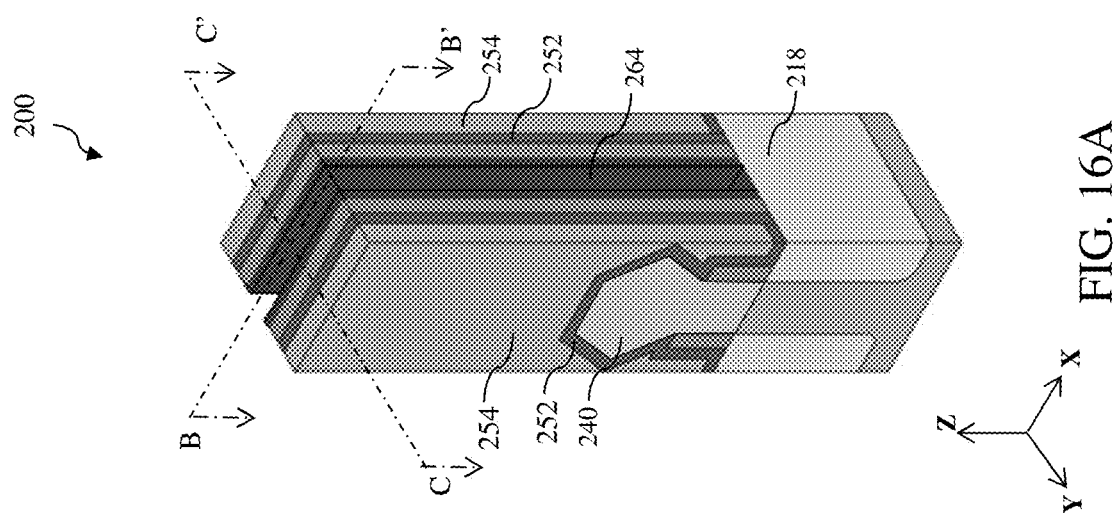

Referring to FIG. 16A-16C, first, the gate interfacial layer 262 is formed around the channel semiconductor layers 210B and over the top surface of the substrate 202. In some embodiments, the gate interfacial layer 262 is only formed over silicon material, thus the gate interfacial layer 262 is not formed around the PDL 212. In some embodiments, the gate interfacial layer 262 may include materials such as $SiO_2$, SiON, HfSiO, other suitable materials, or combinations thereof. A deposition process may be performed to form the gate interfacial layer 262 wrapping around the suspended semiconductor layers 210B and over the substrate 202. The deposition process includes CVD, PVD, ALD, HDPCVD, MOCVD, RPCVD, PECVD, LPCVD, ALCVD, APCVD, plating, other suitable methods, or combinations thereof. In some embodiments, a thickness of the gate interfacial layer 262 in the Z-direction is about 0-3 nm.

Referring to FIG. 16A-16C, the gate dielectric layer 264 is then formed over the gate interfacial layer 262, over the isolation structure 218, and wraps the PDL 212. The gate dielectric layer 264 may be a high-k dielectric layer and include materials such as Hafnium Oxide ($HfO_2$), hafnium silicon oxide (HfSiO), Hafnium Zirconium Oxide (HfZrO), Zirconium Oxide ($ZrO_2$), other suitable materials, or combinations thereof. The gate dielectric layer 264 is deposited by a suitable deposition process, such as CVD, PVD, ALD, HDPCVD, MOCVD, RPCVD, PECVD, LPCVD, ALCVD, APCVD, plating, other suitable methods, or combinations thereof. In some embodiments, a thickness of the gate dielectric layer 264 in the Z-direction is about 1-5 nm.

Now referring to FIGS. 17A-17C, the gate electrode 266 is disposed over the gate dielectric layer 264 and fills the gate trench 256. In some embodiments, the gate electrode 266 may comprise a work function metal layer formed over the gate dielectric layer 264 and a bulk conductive layer formed over the work function metal layer. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate stack 260 may include other material layers, such as a barrier layer, a glue layer, a hard mask layer, and/or a capping layer (not shown). The gate electrode 266 and various other layers of the metal gate stack 268 may be formed by any suitable method, such as CVD, ALD, PVD, plating, chemical oxidation, thermal oxidation, other suitable methods, or combinations thereof.

Now referring to FIG. 1 and FIGS. 18A-18C, at operation 165, the portion of the metal gate stack 268 over the PDL 212 is removed by a planarizing process, for example, a CMP process. In some embodiments, the PDL 212 may be removed slightly during the planarization. In a convention metal gate CMP process, the removing depth of the metal gate is controlled by processing time. The variation of the removing depth of the metal gate on different wafers may be big. However, in the present disclosure, the CMP stops at the PDL 212. In other words, the PDL 212 is used as a stop layer for the CMP process. Thereby, the recessing depth of the metal gate on different wafers are more uniform due to the stop layer control. Furthermore, due to the substantial same space size between the PDL 212 and the topmost channel semiconductor layer 210B and between the channel semiconductor layers 210B, the metal gate portions above each channel semiconductor layers 210B, including the topmost channel semiconductor layer 210B, are substantially the same (same materials and thicknesses). Thereby, the Vt of each channel, including the top channel, of the device 200, are uniform. Therefore, the performance of the device 200 is improved.

Figures 18A, 18B, 18C:
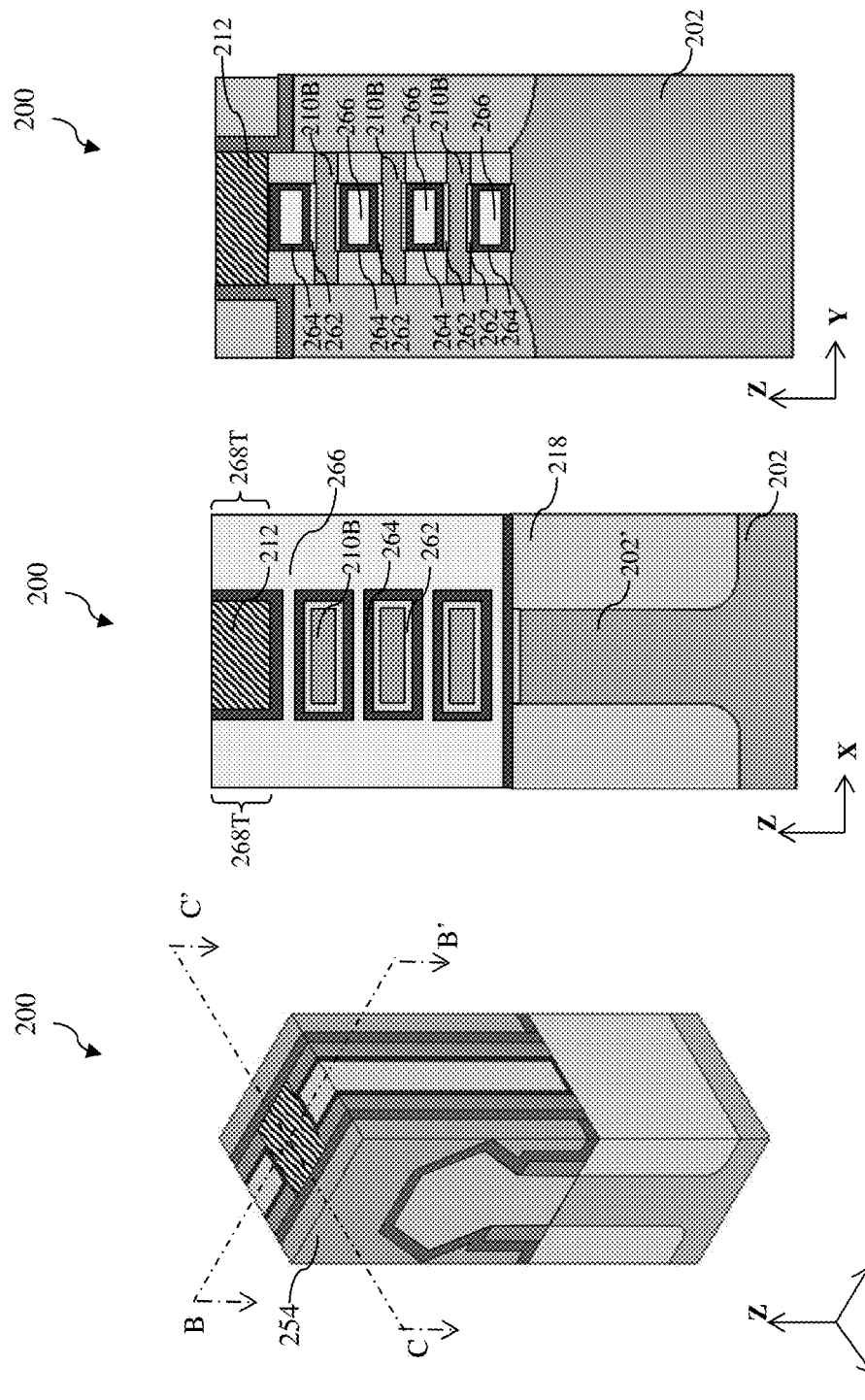

As illustrated in FIG. 18A, in the Y-direction, the PDL 212 extends through the gate spacers 226 to contact the CESL 252; and in the X-direction, the PDL 212 interposes a top portion 268T of the metal gate stack 268. In other words, the metal gate stack 268 includes a trench in the top portion, the PDL 212 is disposed in the trench, and the top surface of the PDL 212 is substantially co-planar with the top surface of the metal gate stack 268.

Figure 19A:
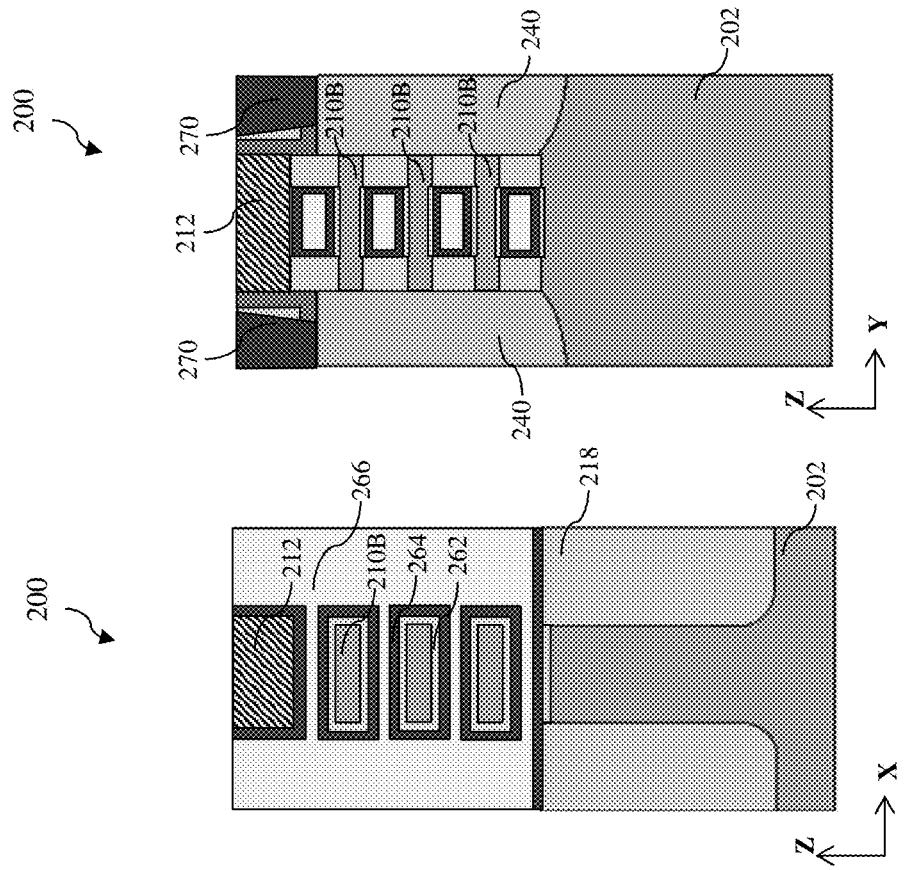
Figure 19B:
Figure 19C:
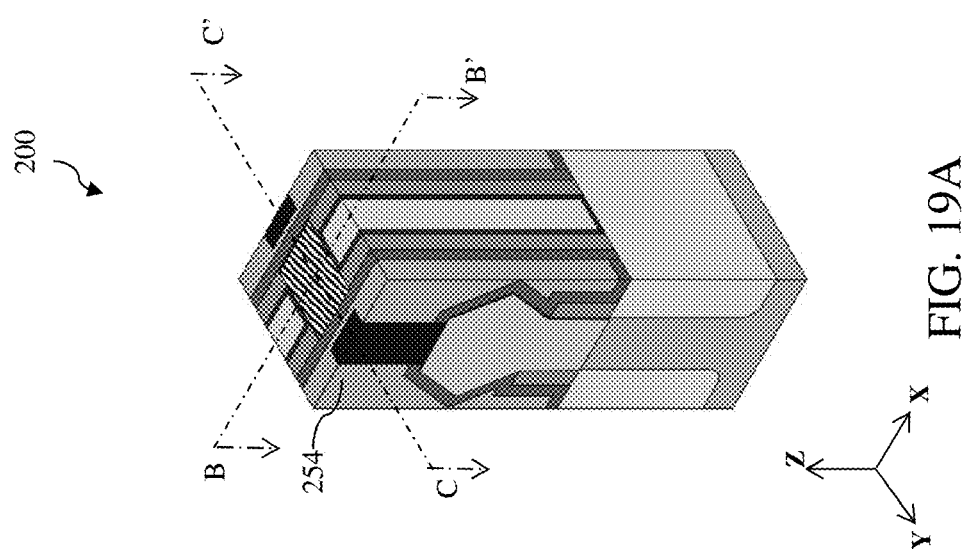

Now referring to FIGS. 1, 19A-19C and 20A-20C, at operation 170, various CESL, ILD layers, contacts and vias are formed over the substrate 202. Referring to FIGS. 19A-19C, S/D contacts 270 are formed over the epitaxial S/D features 240 in the S/D regions of the device 200. In some embodiments, each S/D contact 270 may comprise a metal plug disposed over the epitaxial S/D feature. Each S/D contact 270 may also comprise a silicide layer disposed between the metal plug and the epitaxial S/D feature 240. The silicide layer is optional to further reduce the S/D resistance. In some embodiments, the S/D contacts 270 comprise single metal material. In some other embodiments, the S/D contacts 270 comprise multiple metal layers. A material of the S/D contacts 270 include any suitable electrically conductive material, such as Titanium (Ti), Titanium Nitride (TiN), Nickel (Ni), Molybdenum (Mo), Platinum (Pt), Cobalt (Co), Ruthenium (Ru), Tungsten (W), Tantalum Nitride (TaN), Copper (Cu), other suitable conductive materials, or combinations thereof. The S/D contacts 270 are formed by any suitable processes, for example, lithography process, etch process, PVD, CVD, ALD, electroplating, electroless plating, other suitable deposition process, or combinations thereof. Thereafter, any excess conductive material(s) can be removed by a planarization process, such as a CMP process, thereby planarizing a top surface of device 200.

Figure 20C:
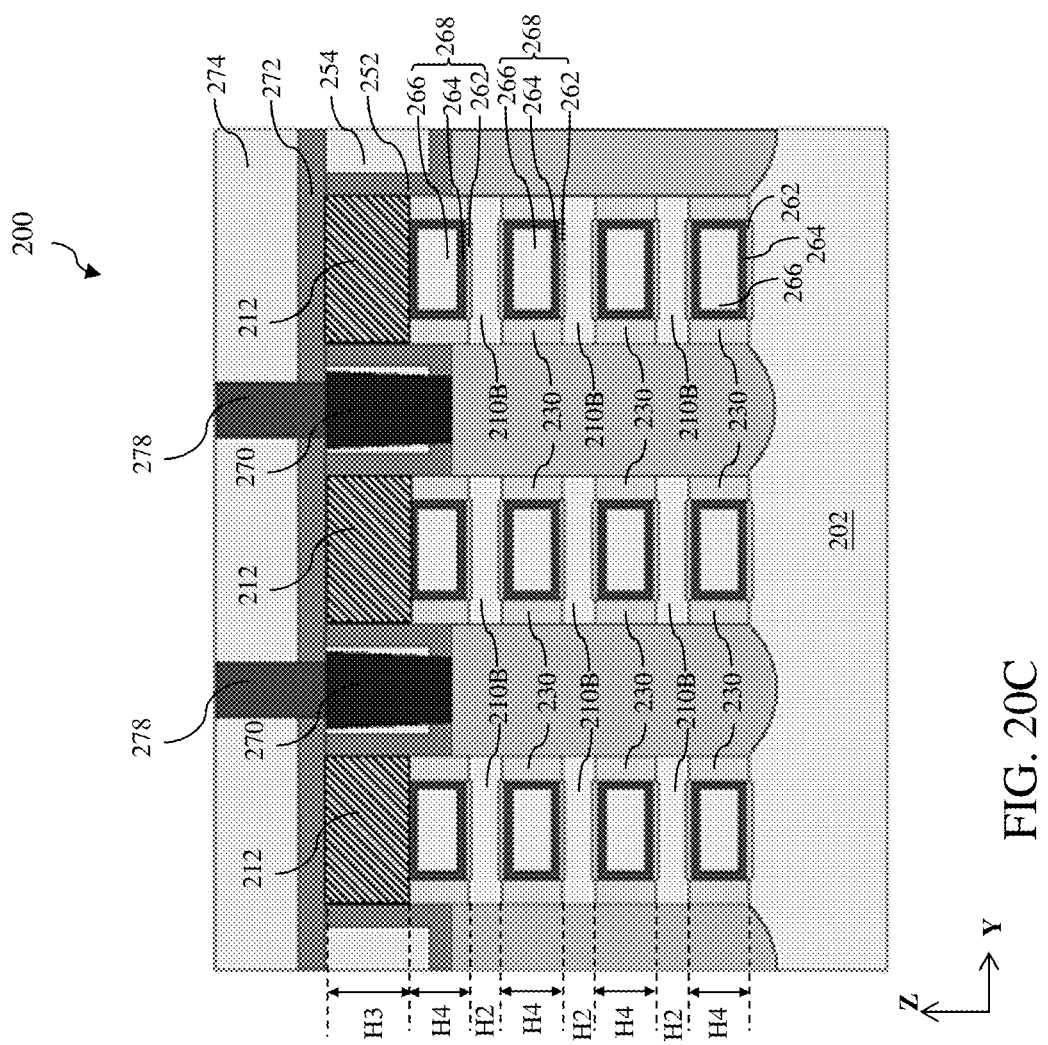

Referring to FIGS. 20A-20C, method 100 performs further processing to complete the fabrication of the device 200. For example, still at operation 170, various contacts, vias (such as gate via 276 and S/D vias 278), interlayer dielectrics (such as CESL 272 and ILD 274), wires, and multilayer interconnect features may be formed over the substrate 202, configured to connect the various features to form a functional circuit that may include one or more multi-gate devices.

FIG. 20C illustrates a cross-section view of device 200 with multiple nanostructures. As depicted in FIG. 20C, each nanostructure includes multiple channel semiconductor layers 210B disposed over the substrate 202. The channel semiconductor layers 210B are separated from each other and are stacked up along a direction generally perpendicular to a top surface of the substrate (i.e. the Z-direction). The PDL 212 is disposed over and is separated from the nanostructure. The shape and size of the PDL 212 in the X-Y plane is substantially same as the shape and size of the channel semiconductor layers 210B in the X-Y plane, respectively. The height H3 of the PDL 212 is about 2-30 nm. The height H2 of each channel semiconductor layers 210B is about 3-15 nm. Each metal gate structure 268 includes gate dielectric layer(s) (for example, the gate interfacial layer 262 and/or the gate dielectric layer 264) wrapping around each channel semiconductor layer 210B in the respective nanostructure and a metal gate electrode 266 disposed over the gate dielectric layer(s). As depicted in FIG. 20C, the gate dielectric layer (for example, the gate dielectric layer 264) is interposed between the metal gate electrode 266 and the PDL 212 and directly contacts the PDL 212, and the PDL 212 is disposed over at least a part of the metal gate electrode 266. A distance H4 between the PDL 212 and the topmost channel semiconductor layer 210B and a distance H4 between the adjacent channel semiconductor layers 210B are substantially the same (for example, about 4-15 nm). Inner spacers 230 are disposed between the PDL 212 and the topmost channel semiconductor layer 210B and between the adjacent channel semiconductor layers 210B. The CESL 272 is deposited over the PDL 212, and a bottom surface of the CESL 272 directly contacts a top surface of the PDL 212. The S/D contacts 270 is disposed over the epitaxial S/D features 240 in the S/D regions of the device 200. And, the S/D vias 278 are disposed over the S/D contacts 270 through the ILD layer 274 and the CESL 272.

Figure 21C:
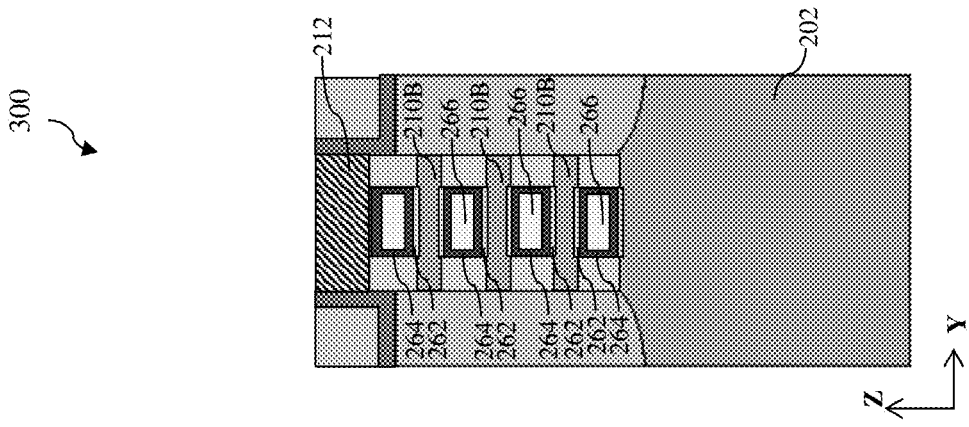
FIGS. 21C and 22C illustrate cross-sectional views of the other example semiconductor device in an X-Z plane at intermediate stages of the method of FIG. 1 in accordance with some embodiments of the present disclosure.
Figure 21B:
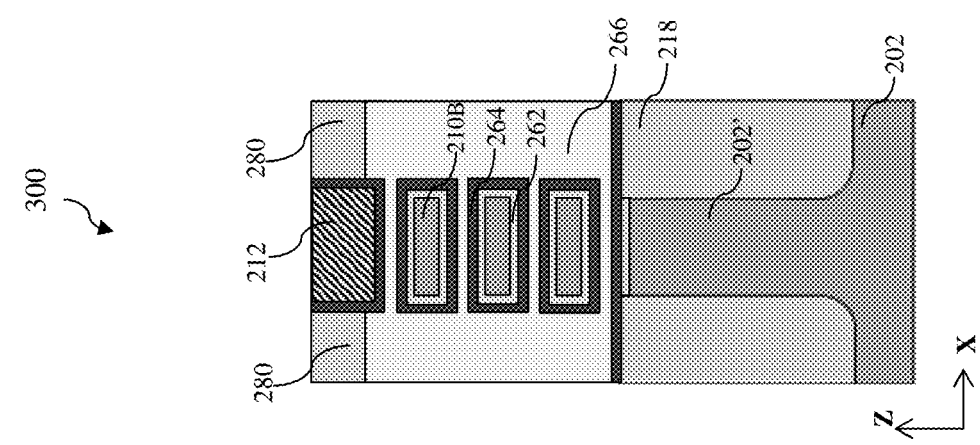
FIGS. 21B and 22B illustrate cross-sectional views of the other example semiconductor device in a Y-Z plane at intermediate stages of the method of FIG. 1 in accordance with some embodiments of the present disclosure.
Figure 21A:
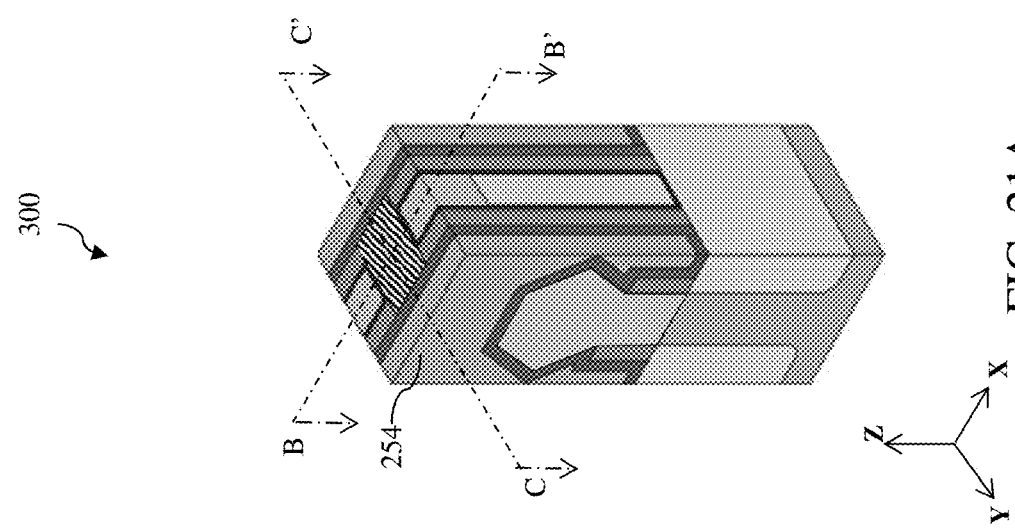
FIGS. 21A and 22A illustrate three-dimensional perspective views of another example semiconductor device at intermediate stages of the method of FIG. 1 in accordance with some embodiments of the present disclosure.

FIGS. 21A-21C and 22A-22C illustrate a semiconductor device 300 (hereinafter called device 300) comprising self-aligned contact (SAC) dielectric layer 280 according to some embodiments of the present disclosure. The device 300 is formed by method 100 and has substantially same three-dimensional and cross-section views as device 200 illustrated in FIGS. 2A-2C to 18A-18C. Thereafter, continuous from FIGS. 21A-21C, SAC dielectric layer 280 are formed over the metal gate electrode 266 at operation 165. In some embodiments, first, the top portion 268T of the metal gate electrode 266 are removed by a suitable process (for example, by an etching process including wet etching, dry etching, or combinations thereof). Subsequently, a dielectric material is disposed over the recessed gate electrode 266 and the PDL 212. In some embodiments, the dielectric material may comprise SiN, SiO, SiON, SiOC, SiOCN, other dielectric material, or combinations thereof. A CMP process is then performed to remove the excess dielectric material until the top surface of the PDL 212 is exposed. The remained dielectric material forms the SAC dielectric layer 280. As depicted in FIGS. 21A and 21B, the SAC dielectric layer 280 are interposed by the PDL 212 in the X-direction. A top surface of the SAC dielectric layer 280 is substantially co-planar with the PDL 212.

Figures 22A, 22B:
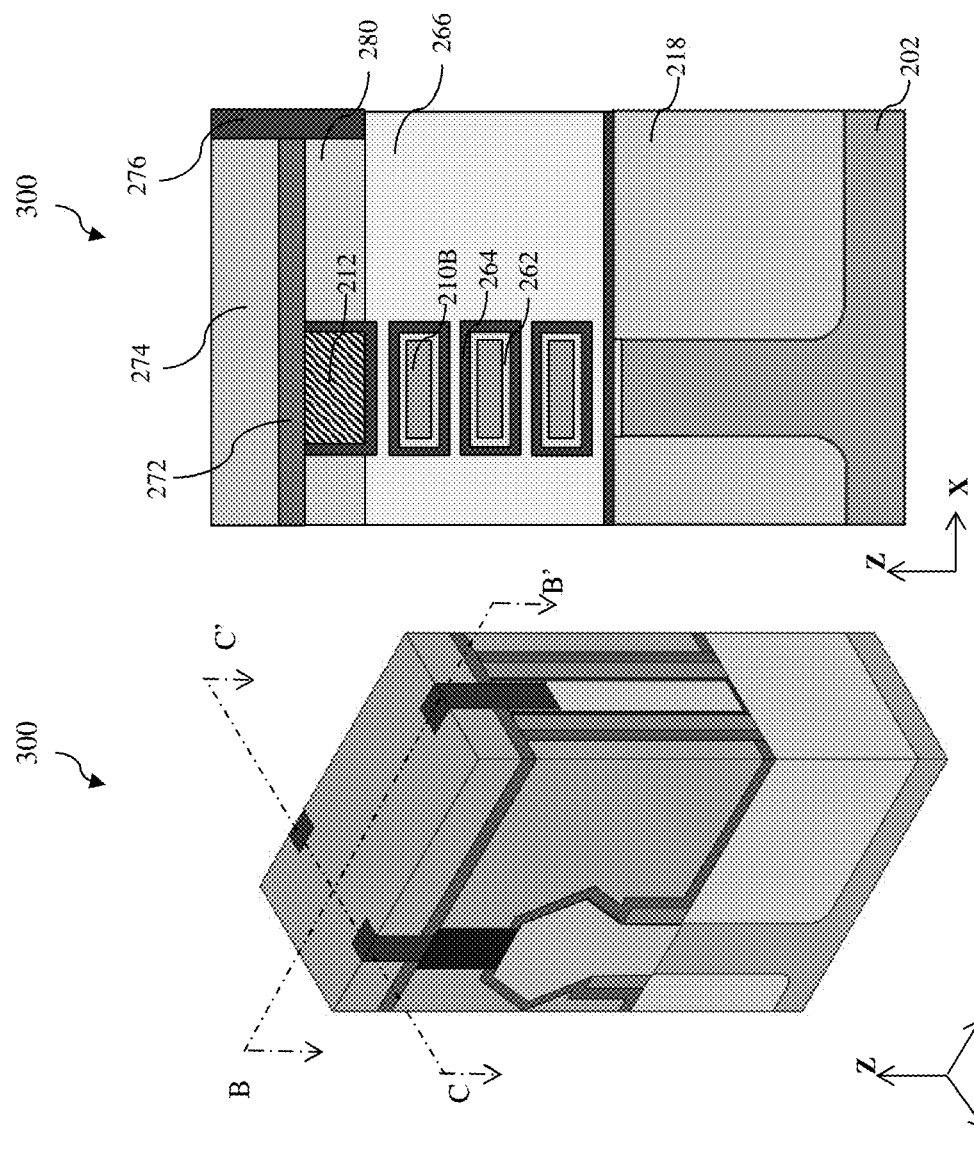
Figure 22C:
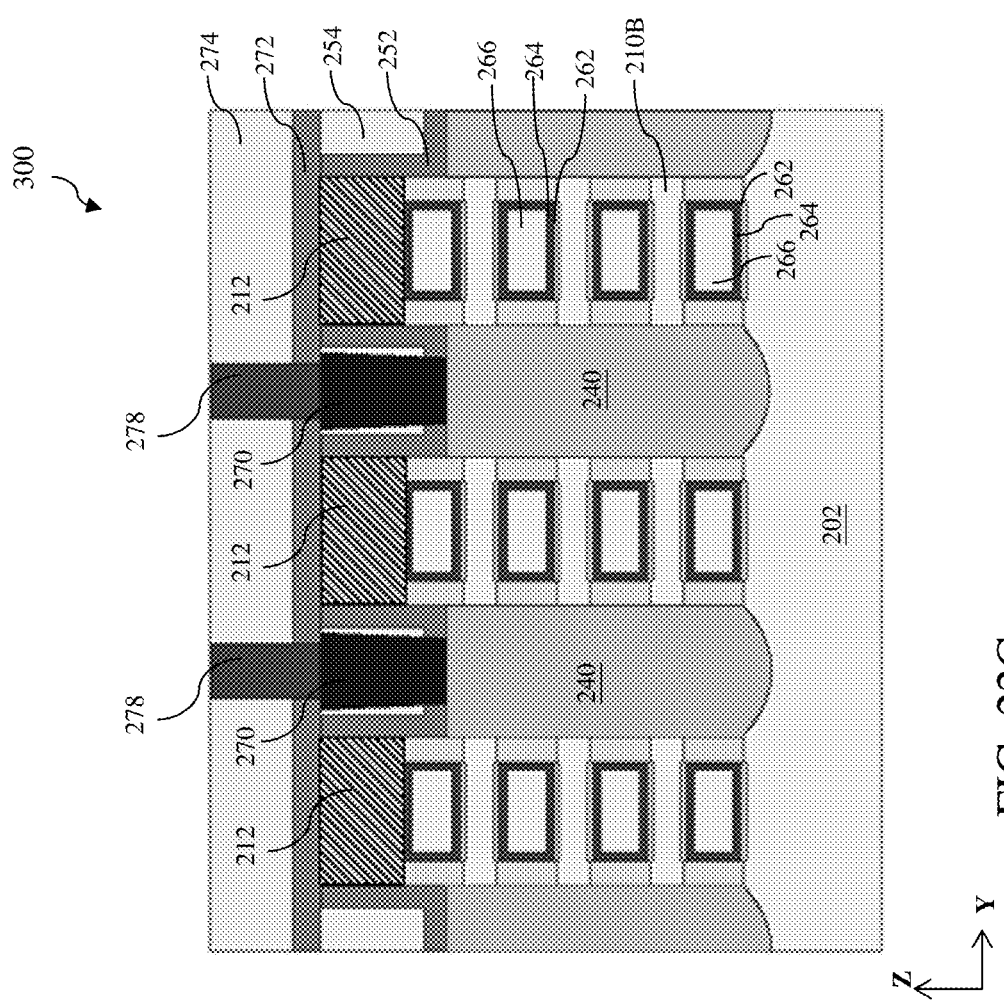

Referring to FIGS. 22A-22C, further processing is performed to complete the fabrication of the device 300. For example, at operation 170, various contacts (such as S/D contacts 270) are formed over the epitaxial S/D features 240 in the S/D regions of the device 300; the interlayer dielectrics (such as CESL 272 and ILD 274) are formed over the SAC dielectric layer 280 and the PDL 212 such that the top surfaces of the SAC dielectric layer 280 and the PDL 212 directly contact the bottom surface of the interlayer dielectrics; and various vias (such as gate via 276 and S/D vias 278), wires, and multilayer interconnect features may be formed over the substrate 202, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure provide a semiconductor device with a protective dielectric layer over the vertically stacked channel semiconductor layers, such that the topmost channel semiconductor layer is protected from being damaged during the dummy gate etching process. Thereby, the high resistance or open channel issue in a conventional semiconductor device can be mitigated. In addition, during the metal gate CMP process, the protective dielectric layer can be used as a stop layer, such that the metal gate removing variation between different wafers may be more uniform than the conventional time control CMP or etching back process. Furthermore, with the protective dielectric layer, the metal gate portion above the topmost channel semiconductor layer is of the same size as those between the adjacent channel semiconductor layers. Thereby, the Vt of the topmost channel and the Vt of other channels of the semiconductor device are more uniform than a conventional semiconductor device. Therefore, with the protective dielectric layer in the present disclosure, the manufacturing defects can be reduced, and the performance of the semiconductor device can be improved.

The present disclosure provides for many different embodiments. Semiconductor device having a protective dielectric layer and methods of fabrication thereof are disclosed herein. An exemplary semiconductor device includes a substrate; semiconductor layers over the substrate, wherein the semiconductor layers are separate from each other and are stacked up along a direction generally perpendicular to a top surface of the substrate; a dielectric feature over and separate from the semiconductor layers; and a gate structure wrapping around each of the semiconductor layers, the gate structure having a gate dielectric layer and a gate electrode layer, wherein the gate dielectric layer interposes between the gate electrode layer and the dielectric feature and the dielectric feature is disposed over at least a part of the gate electrode layer.

In some embodiments, a distance between a bottom surface of the dielectric feature and an upper surface of a topmost layer of the semiconductor layers is substantially the same as a distance between the adjacent semiconductor layers. In some embodiments, a side surface and a bottom surface of the dielectric feature directly contact the gate dielectric layer. In some embodiments, a top surface of the dielectric feature and a top surface of the gate structure are substantially co-planar. In some embodiments, each of the semiconductor layers is a nanosheet or a nanowire.

In some embodiments, the semiconductor device further comprises a gate spacer disposed along a sidewall of the gate structure and a contact etch stop layer disposed along a sidewall of the gate spacer, wherein the dielectric feature extends through the gate spacer to contact the contact etch stop layer. In some embodiments, the semiconductor device further comprises an inner spacer between the dielectric feature and a topmost layer of the semiconductor layers, wherein a bottom surface of the dielectric feature directly contacts a top surface of the inner spacer. In some embodiments, the semiconductor device further comprises a self-aligned contact (SAC) dielectric layer formed over the gate structure, wherein the SAC dielectric layer is separated by the dielectric feature along a direction that is perpendicular to a direction of a gate length.

Another semiconductor device comprises a substrate; semiconductor layers over the substrate, wherein the semiconductor layers are separate from each other and are stacked up along a direction generally perpendicular to a top surface of the substrate; a protective dielectric feature over and separate from the semiconductor layers; and a gate structure wrapping around each of the semiconductor layers; and an etch stop layer over the protective dielectric feature and the semiconductor layers, and a bottom surface of the etch stop layer directly contacting a top surface of the protective dielectric feature.

In some embodiments, a top portion of the gate structure includes a trench, the protective dielectric feature is formed in the trench, and the bottom surface of the etch stop layer directly contacts a top surface of the gate structure. In some embodiments, in a direction that is perpendicular to a direction of a gate length, a width of the protective dielectric feature is substantially equal to a width of the semiconductor layers.

In some embodiments, the semiconductor device further comprises a self-aligned contact (SAC) dielectric layer over the gate structure, wherein the bottom surface of the etch stop layer directly contacts a top surface of the SAC dielectric layer.

An exemplary method includes receiving a structure including a substrate and a stack of first semiconductor layers and second semiconductor layers alternately disposed over the substrate, wherein a topmost layer of the stack is one of the first semiconductor layers and includes a different material than the second semiconductor layers and the substrate; forming a protective dielectric layer over the stack, wherein a bottom surface of the protective dielectric layer directly contacts a top surface of the topmost layer of the stack; selectively removing the first semiconductor layers such that the second semiconductor layers and the protective dielectric layer are suspended over the substrate; and after the selectively removing, forming a metal gate stack wrapping around the second semiconductor layers and the protective dielectric layer.

In some embodiments, the method further includes planarizing the metal gate stack to expose the protective dielectric layer. In some further embodiments, the method further includes recessing a top portion of the metal gate stack; depositing a conductive material over the recessed metal gate stack and the protective dielectric layer; and planarizing the conductive material to expose the protective dielectric layer. In some further embodiments, the method further includes depositing an interlayer dielectric layer over the metal gate stack and the protective dielectric layer.

In some embodiments, forming the protective dielectric layer includes depositing the protective dielectric layer over the topmost layer of the stack; depositing a hard mask over the protective dielectric layer; patterning the hard mask; etching the protective dielectric layer and the stack using the hard mask as etch mask; and removing the hard mask. In some embodiments, forming the metal gate stack includes depositing a gate dielectric layer to wrap around the second semiconductor layers and the protective dielectric layer; and depositing a gate electrode layer over the gate dielectric layer.

In some embodiments, the method further includes, before the selectively removing, forming a dummy gate structure over the protective dielectric layer and the stack; forming a gate spacer along a sidewall of the dummy gate structure; forming an epitaxial source/drain feature connecting to the second semiconductor layers; and removing the dummy gate structure to expose the protective dielectric layer and the stack. In some further embodiments, the method further includes removing a portion of the protective dielectric layer and the stack to form a trench exposing the substrate; from the trench, selectively removing portions of the first semiconductor layers to form gaps; and forming an inner spacer in the gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a stack of semiconductor layers over a substrate, the stack of semiconductor layers including a first semiconductor layer and a second semiconductor layer;
    forming a protective dielectric layer directly on the second semiconductor layer, wherein the forming of the protective dielectric layer directly on the second semiconductor layer includes:
        forming a hard mask on the protective dielectric layer;
        patterning the protective dielectric layer and the stack of semiconductor layers while using the hard mask as a mask; and
        removing the hard mask;
    forming a first gate dielectric layer directly on the protective dielectric layer;
    removing the first gate dielectric layer to expose the protective dielectric layer;
    removing a first portion of the second semiconductor layer;
    forming a second gate dielectric layer directly on the protective dielectric layer and the first semiconductor layer; and
    forming a gate electrode around the second gate dielectric layer.

2. The method of claim 1, further comprising:
    removing a second portion of the second semiconductor layer such that the first portion of the second semiconductor layer remains after the removing of the second portion of the second semiconductor layer; and
    forming a first spacer feature directly on the first portion of the second semiconductor layer.

3. The method of claim 2, further comprising forming a source/drain feature on the substrate, the source/drain feature interfacing with the first spacer feature and the first semiconductor layer.

4. The method of claim 2, wherein the first spacer feature extends from the protective dielectric layer to the first semiconductor layer after the forming of the first spacer feature directly on the first portion of the second semiconductor layer.

5. The method of claim 2, wherein the first spacer feature remains after the removing of the first portion of the second semiconductor layer, and
    wherein the forming of the second gate dielectric layer directly on the protective dielectric layer and the first semiconductor layer includes forming the second gate dielectric layer directly on the first spacer feature.

6. The method of claim 1, wherein the forming of the second gate dielectric layer directly on the protective dielectric layer and the first semiconductor layer includes forming an interfacial layer directly on the protective dielectric layer and the first semiconductor layer and forming a high-k dielectric layer on the interfacial layer.

7. The method of claim 1, wherein the forming of the first gate dielectric layer directly on the protective dielectric layer includes forming the first gate dielectric layer directly on a top surface of the protective dielectric layer, the top surface of the protective dielectric layer facing away from the substrate, and
    wherein the removing of the first gate dielectric layer to expose the protective dielectric layer includes the top surface of the protective dielectric layer being exposed by the removal of the first gate dielectric layer.

8. The method of claim 1, further comprising removing a portion of the second gate dielectric layer and a portion of the gate electrode to expose a portion of the protective dielectric layer.

9. The method of claim 1, further comprising forming an etch stop layer directly on a sidewall of the protective dielectric layer after the forming of the first gate dielectric layer directly on the protective dielectric layer.

10. A method comprising:
forming a fin structure on a substrate, the fin structure including a first semiconductor layer, a second semiconductor disposed over the first semiconductor layer and a protective dielectric layer disposed over the second semiconductor layer;
removing a first portion of the second semiconductor layer such that a second portion of the second semiconductor layer remains disposed over the first semiconductor layer after the removing of the first portion of the second semiconductor layer;
forming a first spacer feature along a sidewall of the second portion of the second semiconductor layer;
removing the second portion of the second semiconductor layer to form an air gap between the protective dielectric layer and the first semiconductor layer;
forming a gate structure within the air gap, the gate structure including a first gate dielectric and a first gate electrode, the first gate dielectric interfacing with at least one of the protective dielectric layer and the first semiconductor layer; and
forming a second gate dielectric directly on the protective dielectric layer prior to the removing of the first portion of the second semiconductor layer.

11. The method of claim 10, wherein the forming of the gate structure within the air gap includes forming the gate structure over the protective dielectric layer such that a top surface of the protective dielectric layer is covered by the gate structure.

12. The method of claim 11, further comprising removing a portion of the gate structure to expose the top surface of the protective dielectric layer.

13. The method of claim 12, further comprising:
forming an etch stop layer directly on the exposed top surface of the protective dielectric layer; and
forming a contact through the etch stop layer to the first gate electrode of the gate structure.

14. A method of forming a semiconductor device, comprising:
receiving a structure including a substrate and a stack of first semiconductor layers and second semiconductor layers alternately disposed over the substrate, wherein a topmost layer of the stack is one of the first semiconductor layers and includes a different material than the second semiconductor layers and the substrate;
forming a protective dielectric layer over the stack, wherein a bottom surface of the protective dielectric layer directly contacts a top surface of the topmost layer of the stack, wherein forming the protective dielectric layer includes:
depositing the protective dielectric layer over the topmost layer of the stack;
depositing a hard mask over the protective dielectric layer;
patterning the hard mask;
etching the protective dielectric layer and the stack using the hard mask as etch mask; and
removing the hard mask;
selectively removing the first semiconductor layers such that the second semiconductor layers and the protective dielectric layer are suspended over the substrate; and
after the selectively removing, forming a metal gate stack wrapping around the second semiconductor layers and the protective dielectric layer.

15. The method of claim 14, further comprising:
planarizing the metal gate stack to expose the protective dielectric layer.

16. The method of claim 15, further comprising:
recessing a top portion of the metal gate stack;
depositing a conductive material over the recessed metal gate stack and the protective dielectric layer; and
planarizing the conductive material to expose the protective dielectric layer.

17. The method of claim 15, further comprising:
depositing an interlayer dielectric layer over the metal gate stack and the protective dielectric layer.

18. The method of claim 14, before the selectively removing, further comprising:
forming a dummy gate structure over the protective dielectric layer and the stack;
forming a gate spacer along a sidewall of the dummy gate structure;
forming an epitaxial source/drain feature connecting to the second semiconductor layers; and
removing the dummy gate structure to expose the protective dielectric layer and the stack.

19. The method of claim 18, further comprising:
removing a portion of the protective dielectric layer and the stack to form a trench exposing the substrate;
from the trench, selectively removing portions of the first semiconductor layers to form gaps; and
forming an inner spacer in the gaps.

20. The method of claim 14, wherein forming the metal gate stack includes:
depositing a gate dielectric layer to wrap around the second semiconductor layers and the protective dielectric layer; and
depositing a gate electrode layer over the gate dielectric layer.

* * * * *